(12) United States Patent
Oshikubo et al.

(10) Patent No.: US 8,624,308 B2
(45) Date of Patent: Jan. 7, 2014

(54) IMAGE SENSOR FIVE TRANSISTOR PIXEL ELEMENT WITH FOUR CONTROL SIGNALS

(75) Inventors: Hiromichi Oshikubo, Tsukuba (JP); Satoru Adachi, Tsuchiura (JP)

(73) Assignee: Texas Instruments Incorporated, Dallas, TX (US)

( * ) Notice: Subject to any disclaimer, the term of this patent is extended or adjusted under 35 U.S.C. 154(b) by 984 days.

(21) Appl. No.: 12/032,966

(22) Filed: Feb. 18, 2008

(65) Prior Publication Data

US 2008/0210993 A1 Sep. 4, 2008

(30) Foreign Application Priority Data

Feb. 16, 2007 (JP) ................................. 2007-036978

(51) Int. Cl.
*H01L 31/062* (2012.01)
(52) U.S. Cl.
USPC .................... 257/292; 257/291; 257/E21.115
(58) Field of Classification Search
USPC .................. 257/291, 292, E33.054, E21.115, 257/E31.121, E27.133, E29.282, 222, 225, 257/239; 438/48; 348/308, 241
See application file for complete search history.

(56) References Cited

U.S. PATENT DOCUMENTS

| | | | |
|---|---|---|---|
| 7,238,926 B2 * | 7/2007 | Guidash et al. | 250/208.1 |
| 7,550,793 B2 * | 6/2009 | Itano et al. | 257/239 |
| 7,800,673 B2 * | 9/2010 | Sugawa et al. | 348/308 |
| 2004/0149887 A1 * | 8/2004 | Agarwal | 250/208.1 |
| 2004/0251394 A1 * | 12/2004 | Rhodes et al. | 250/208.1 |
| 2006/0203123 A1 * | 9/2006 | Kasai | 348/372 |
| 2006/0221667 A1 * | 10/2006 | Ogura et al. | 365/149 |
| 2006/0255380 A1 * | 11/2006 | Lee | 257/291 |
| 2006/0261246 A1 * | 11/2006 | Krymski | 250/208.1 |
| 2007/0023798 A1 * | 2/2007 | McKee | 257/291 |
| 2008/0157152 A1 * | 7/2008 | Shim | 257/292 |

* cited by examiner

*Primary Examiner* — Cuong Q Nguyen
*Assistant Examiner* — Yosef Gebreyesus
(74) *Attorney, Agent, or Firm* — Lawrence J. Bassuk; Wade J. Brady, III; Frederick J. Telecky, Jr.

(57) ABSTRACT

The invention provides a solid-state image pickup device and method for realizing a higher sensitivity and a higher S/N ratio especially in the low-luminance region while maintaining a wide dynamic range. Plural pixels are integrated in an array configuration on a semiconductor substrate with each pixel having photodiode PD, which receives light and generates and stores photoelectric charge, transfer transistor Tr1, which transfers such photoelectric charge from such photodiode, floating diffusion FD, which transfers such photoelectric charge through such transfer transistor, additive capacitive element Cs, which is set connected via the floating diffusion to the photodiode, capacitive coupling transistor Tr2, which combines or divides the capacitance of such floating diffusion and the capacitance of such additive capacitive element, and reset transistor Tr3, which is connected to such additive capacitive element or floating diffusion; and the capacitance of the floating diffusion is smaller than that of the photodiode.

2 Claims, 17 Drawing Sheets

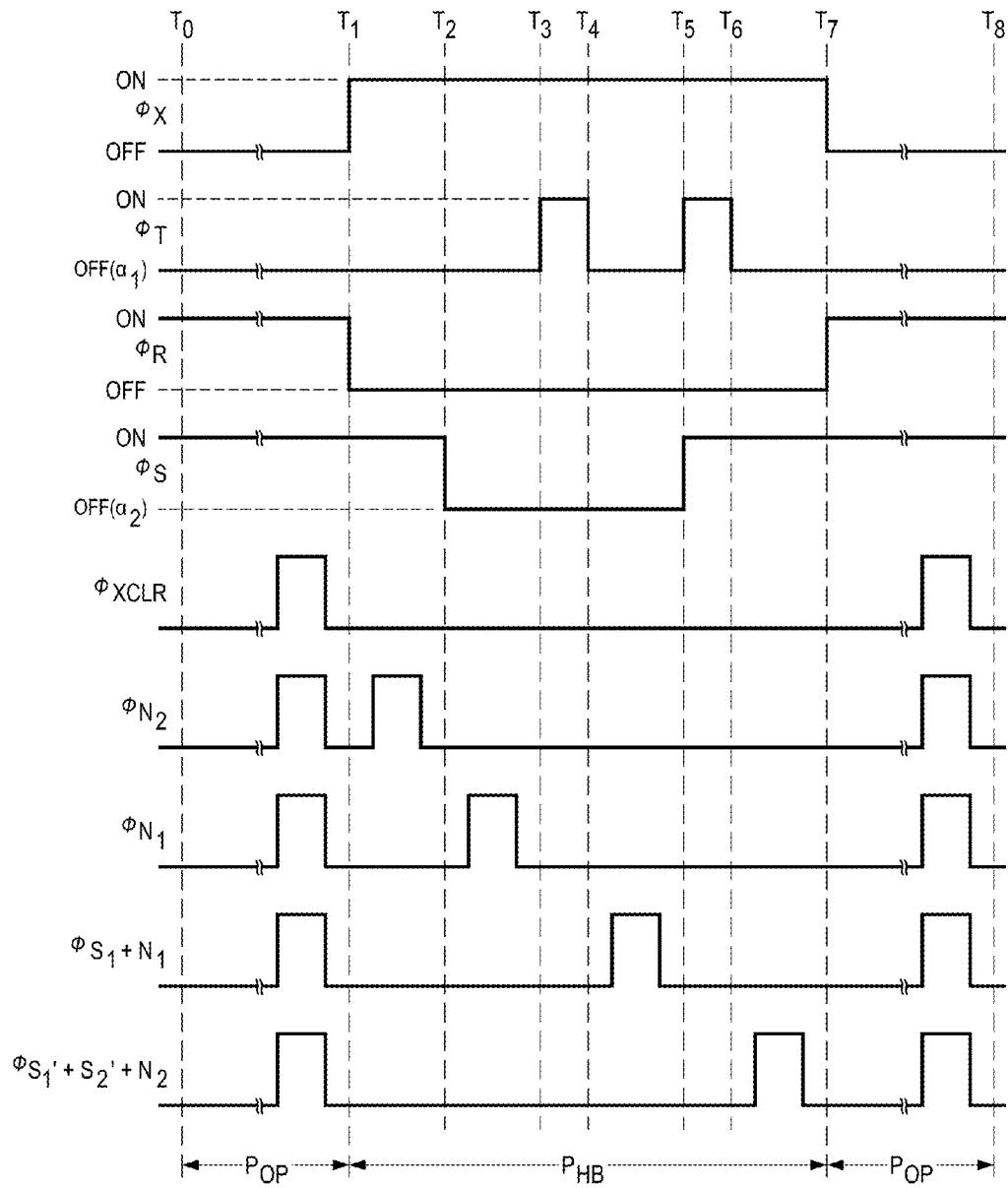

US 8,624,308 B2

IMAGE SENSOR FIVE TRANSISTOR PIXEL ELEMENT WITH FOUR CONTROL SIGNALS

This application claims priority from Japanese Patent Application No. 2007-036978, filed 16 Feb. 2007.

FIELD OF THE INVENTION

This relates to solid-state image pickup devices and methods.

BACKGROUND

The demand for image input image sensors, such as CMOS (complementary metal-oxide-semiconductor) image sensors or CCD (charge coupled device) image sensors, in the application fields of digital cameras and cellular phones equipped with cameras, has increased along with the performance improvement of such image sensors. Image sensors with improved performance characteristics are desired. One such characteristic is expansion of the dynamic range. For such image sensors, further improvement in characteristics is demanded, and one of the characteristics is the dynamic range that should be expanded.

Examples of solid-state image pickup devices designed for realizing a wider dynamic range are given in Japanese Kokai Patent Application No. 2003-134396, Japanese Kokai Patent Application No. 2000-165754, Japanese Kokai Patent Application No. 2002-77737, and Japanese Kokai Patent Application No. Hei 5[1993]-90556. However, for such solid-state image pickup devices, a wide dynamic range is difficult to realize while maintaining high sensitivity and a high S/N ratio.

To address this problem, another type of solid-state image pickup device, shown in Japanese Kokai Patent Application No. 2005-328493, was developed. In that solid-state image pickup device, the structure is such that photoelectric charge overflowing from the photodiode of each pixel is stored in a floating diffusion and an electrostatic capacitive element. When photoelectric charge does not overflow from the photodiode, the photoelectric charge in the photodiode is used to obtain the signal of each pixel. On the other hand, when it overflows, the sum of the photoelectric charge in the photodiode and the photoelectric charge that has overflowed from the photodiode gives the signal of the pixel. When such solid-state image pickup device is manufactured using the CMOS process, however, the dark current component with respect to the photoelectric charge that has overflowed from such photodiode increases by about 3-4 orders of magnitude higher than the required level. Consequently, it is inappropriate for use for storage of photoelectric charge over a long period of time, and there is a demand for development of a scheme to suppress such dark current. For example, the sites of generation of the dark current component include the interface directly below the gate of the transistor, the side surface of the element separating insulating film, the portion of the silicon surface contacting the depletion layer, etc.

International Patent Application Publication No. WO 2005/083790, Japanese Kokai Patent Application No. 2005-328493, and Japanese Kokai Patent Application No. 2006-217410 disclose solid-state image pickup devices that can suppress the dark current component and can expand the dynamic range while maintaining high sensitivity and a high S/N ratio. And, for these solid-state image pickup devices, efforts have been made to realize high sensitivity and a high S/N ratio especially in the low-luminance region.

The problem to be solved is how to realize high sensitivity and a high S/N ratio, especially in the low irradiation region, while maintaining a wide dynamic range.

SUMMARY OF THE INVENTION

The invention addressed the above problem.

Embodiments of the invention provide a type of solid-state image pickup device with the following characteristics. The device has a plurality of pixels integrated in an array configuration on a semiconductor substrate. Each pixel has a photodiode which receives light and generates and stores photoelectric charge; a transfer transistor which transfers the photoelectric charge from the photodiode; a floating diffusion which transfers the photoelectric charge through the transfer transistor; an additive capacitive element which is connected via the floating diffusion to the photodiode, and which stores the photoelectric charge transferred through the transfer transistor from the photodiode; a capacitive coupling transistor which combines or divides the floating diffusion and the additive capacitive element; and a reset transistor which is connected to the additive capacitive element or the floating diffusion for exhausting the photoelectric charge from within the additive capacitive element and/or the floating diffusion; and the capacitance of the floating diffusion is smaller than that of such photodiode.

The solid-state image pickup device is formed by integrating plural pixels in an array configuration on a semiconductor substrate, with each pixel comprising a photodiode, a transfer transistor, a floating diffusion, an additive capacitive element, a capacitive coupling transistor, and a reset transistor. The photodiode receives light to generate photoelectric charge and store it. The transfer transistor transfers photoelectric charge from the photodiode. The floating diffusion transfers the photoelectric charge through the transfer transistor. The additive capacitive element is set connected via such floating diffusion to the photodiode, and it stores the photoelectric charge transferred from the photodiode via the transfer transistor. The capacitive coupling transistor combines or divides the floating diffusion and the additive capacitive element. The reset transistor is connected to the additive capacitive element or floating diffusion, and it exhausts the photoelectric charge in the additive capacitive element and/or such floating diffusion. Here, the structure is such that the capacitance of the floating diffusion is smaller than that of the photodiode.

The described solid-state image pickup device embodiments are preferably configured so that the sum of the capacitance of the floating diffusion and the capacitance of the additive capacitive element is larger than the capacitance of the photodiode. It is more preferred that the capacitance of such floating diffusion be smaller than the capacitance of such additive capacitive element. Such embodiments also preferably have their additive capacitive element is made of the capacitance of an impurity diffusion layer formed on the semiconductor substrate. Such solid-state image pickup devices preferably have a reset transistor shared by a plurality of such pixels. Such solid-state image pickup devices preferably have pixels which also have an amplifying transistor with a gate electrode connected to such floating diffusion, and a selecting transistor that selects such pixel connected in series to such amplifying transistor. In addition, in such solid-state image pickup devices, the selecting transistor is preferably shared by a plurality of the pixels. Also, it is preferred that the capacitive coupling transistor and the floating diffusion be shared by a plurality of such pixels. In addition, it is preferred that the reset transistor be shared by a plurality of pixels.

In addition, the invention provides an operating method for a solid-state image pickup device. In a described embodiment, the method is for operation of a solid-state image pickup device that has plural pixels integrated in an array configuration on a semiconductor substrate; each such pixel having a photodiode which receives light and generates and stores photoelectric charge, a transfer transistor which transfers such photoelectric charge from such photodiode, a floating diffusion which transfers such photoelectric charge through such transfer transistor, an additive capacitive element which is set connected via such floating diffusion to such photodiode and stores the photoelectric charge transferred through such transfer transistor from such photodiode, a capacitive coupling transistor which combines or divides such floating diffusion and such additive capacitive element, and a reset transistor which is connected to such additive capacitive element or such floating diffusion for exhausting the photoelectric charge from within such additive capacitive element and/or such floating diffusion. The capacitance of the floating diffusion is smaller than that of the photodiode.

The described method embodiment includes the following steps: a step of operation in which the photoelectric charge generated as light is received by such photodiode during the storage period and is stored in such photodiode; a step of operation in which a portion of all of the photoelectric charge stored in such photodiode is transferred to such floating diffusion to obtain a first signal; and a step of operation in which all of the photoelectric charge stored in such photodiode is transferred to the coupling capacitance obtained by a combination of such floating diffusion and such additive capacitive element to obtain a second signal.

Such method is for operation of a solid-state image pickup device that has plurality of pixels integrated in an array configuration on a semiconductor substrate; each such pixel having a photodiode which receives light and generates and stores photoelectric charge, a transfer transistor which transfers such photoelectric charge from such photodiode, a floating diffusion which transfers such photoelectric charge through such transfer transistor, an additive capacitive element which is set connected via such floating diffusion to such photodiode and which stores the photoelectric charge transferred through such transfer transistor from such photodiode, a capacitive coupling transistor which combines or divides such floating diffusion and such additive capacitive element, and a reset transistor which is connected to such additive capacitive element or such floating diffusion for exhausting the photoelectric charge from within such additive capacitive element and/or such floating diffusion; and the capacitance of such floating diffusion is smaller than that of such photodiode. First, the photoelectric charge generated as light is received by such photodiode during the storage period and is stored in the photodiode. Then, a portion of all of the photoelectric charge stored in the photodiode is transferred to such floating diffusion to obtain a first signal. Then, all of the photoelectric charge stored in the photodiode is transferred to the coupling capacitance obtained by a combination of the floating diffusion and additive capacitive element to obtain a second signal.

In such operating method for a solid-state image pickup device, the first signal is preferably taken as the output of the pixel when the first signal is lower than the saturated signal of the floating diffusion, and the second signal is taken as the output of the pixel when the first signal is higher than the saturated signal of the floating diffusion.

Also, the invention provides a type of solid-state image pickup device characterized by the following facts: the solid-state image pickup device has plural pixels integrated in an array configuration on a semiconductor substrate; each the pixel has a photodiode, which receives light and generates and stores photoelectric charge, a transfer transistor, which transfers the photoelectric charge from the photodiode, a floating diffusion, which transfers the photoelectric charge through the transfer transistor, an additive capacitive element, which is set connected via the floating diffusion to the photodiode, and which stores the photoelectric charge transferred through the transfer transistor from the photodiode, a capacitive coupling transistor, which combines or divides the floating diffusion and the additive capacitive element, a reset transistor, which is connected to the additive capacitive element or the floating diffusion for exhausting the photoelectric charge from within the additive capacitive element and/or the floating diffusion, an amplifying transistor having a gate electrode connected to the floating diffusion, and a selecting transistor for selecting the pixel connected in series to the amplifying transistor; and the selecting transistor is shared by plural the pixels.

In addition, embodiments of the invention provide a type of solid-state image pickup device having plural pixels integrated in an array configuration on a semiconductor substrate, with each pixel consisting of a transfer transistor, floating diffusion, additive capacitance element, capacitive coupling transistor, reset transistors amplifying transistor, and selecting transistor. The photodiode receives light and generates and stores photoelectric charge. The transfer transistor transfers the photoelectric charge from the photodiode. The floating diffusion transfers the photoelectric charge through the transfer transistor. The additive capacitive element is set connected via the floating diffusion to the photodiode, and it stores the photoelectric charge transferred through the transfer transistor from the photodiode. The capacitive coupling transistor combines or divides the floating diffusion and the additive capacitive element. The reset transistor is connected to the additive capacitive element or the floating diffusion for exhausting the photoelectric charge from within the additive capacitive element and/or the floating diffusion. The amplifying transistor has a gate electrode connected to the floating diffusion. The selecting transistor is connected in series to the amplifying transistor and selects the pixel. Here, the selecting transistor is shared by plural the pixels.

The solid-state image pickup device of the invention can realize high sensitivity and a high S/N ratio especially in the low-luminance region while maintaining a wide dynamic range.

According to the operating method for the solid-state image pickup device of the invention, the solid-state image pickup device can work such that high sensitivity and a high S/N ratio can be realized especially in a low-luminance region while a wide dynamic range is maintained.

The solid-state image pickup device of the invention can realize smaller pixels and can help reduce the size of the device for a solid-state image pickup device that can realize a wide dynamic range.

Solid-state image pickup devices in accordance with the principles of the invention may be adopted in CMOS image sensors and CCD image sensors carried on digital cameras and camera-attached cell phones, which demand a wide dynamic range. Methods in accordance with the principles of the invention may be adopted in the operation of image sensors that demands a wide dynamic range.

BRIEF DESCRIPTION OF THE DRAWINGS

Example embodiments are described below with reference to accompanying drawings, wherein:

FIG. 6 is a timing chart illustrating the voltage applied to the driving line of the CMOS image sensor corresponding to FIG. 4 of the first embodiment, shown as two levels of ON/OFF.

DESCRIPTION OF EXAMPLE EMBODIMENTS

Figure 1:
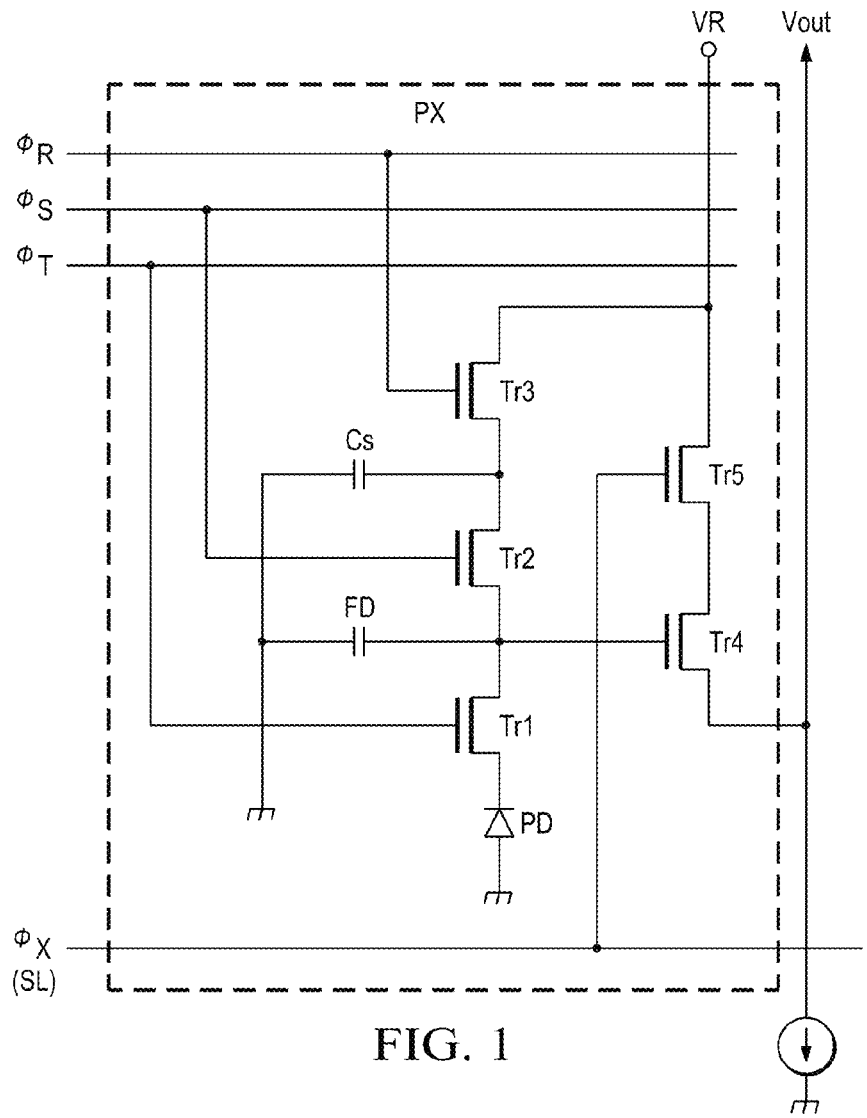
FIG. 1 is an equivalent circuit diagram illustrating one pixel PX (pixel) of the CMOS image sensor according to a first embodiment of the invention.

Example embodiments for implementing principles of the invention are described below:
First Embodiment The solid-state image pickup device pertaining to the present embodiment is a CMOS image sensor. FIG. 1 is an equivalent circuit diagram illustrating one pixel PX (pixel).

For a so-called five-transistor type CMOS image sensor, each pixel includes the following elements: a photodiode PD which receives light and generates and stores photoelectric charge; a transfer transistor Tr1 which transfers such photoelectric charge from such photodiode PD; a floating diffusion FD which transfers such photoelectric charge through such transfer transistor Tr1; an additive capacitive element Cs; a capacitive coupling transistor Tr2 which combines or divides the capacitance of such floating diffusion FD and the capacitance of such additive capacitive element Cs; a reset transistor Tr3 which is connected to floating diffusion FD and exhausts the photoelectric charge in floating diffusion FD; an amplifying transistor Tr4 (source follower SF) that amplifies and converts the photoelectric charge in floating diffusion FD to a voltage signal; and a selecting transistor Tr5 that is formed connected in series to the amplifying transistor and is for selecting the pixel. For example, such five transistors may all be n-channel MOS transistors.

For the CMOS image sensor in this embodiment, pixels each having the aforementioned composition are integrated. In each pixel, driving lines of φT, φS and φR are connected to the gate electrodes of transfer transistor Tr1, capacitive coupling transistor Tr2 and reset transistor Tr3, respectively. Also, pixel selecting line SL (φX) driven by a row shift transistor is connected to the gate electrode of selecting transistor Tr5. A prescribed voltage VR is applied to the source/drain of one of reset transistor Tr3 and selecting transistor Tr5, and output line Vout is connected to the output-side source/drain of amplifying transistor Tr4, and a voltage signal controlled by the column shift register is output. For selecting transistor Tr5 and driving line φX, the voltage of floating diffusion FD can be fixed at an appropriate level such that the selection/non-selection operation of a pixel can be performed. Consequently, they may also be omitted.

Figure 2:
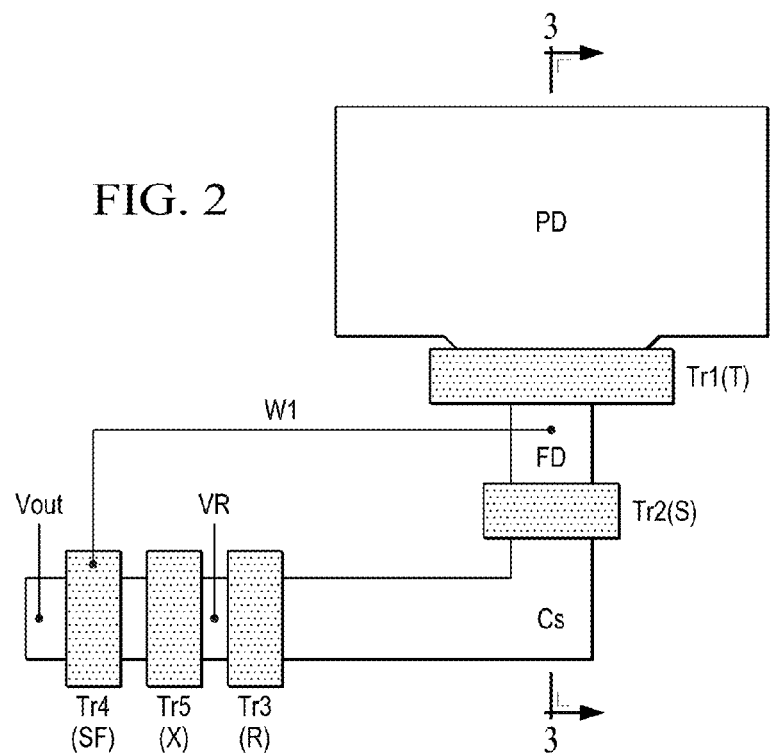
FIG. 2 is a layout diagram illustrating an example of one pixel (1 pixel) in the CMOS image sensor of the first embodiment.

FIG. 2 is a layout diagram illustrating an example of a pixel (1 pixel) of the CMOS image sensor in the first embodiment. Photodiode PD, additive capacitive element Cs and the five transistors Tr1-Tr5 are arranged as shown in the drawing; floating diffusion FD, between such transfer transistor Tr1 (T) and the gate of capacitive coupling transistor Tr2 (S), and amplifying transistor Tr4 (Source follower SF) are connected to each other by wiring W1; and wiring of prescribed voltage VR is connected to the diffusion layer between reset transistor Tr3 (R) and selecting transistor Tr5 (X). In this way, a circuit corresponding to the equivalent circuit diagram in the present embodiment shown in FIG. 1 can be realized.

In this layout, the width of the channel of transfer transistor Tr1 is formed wider on the side of photodiode PD, and narrower on the side of floating diffusion FD. Consequently, instant transfer of the photoelectric charge from the photodiode to the floating diffusion is possible. On the other hand, by having a narrower dimension on the side of floating diffusion FD, it is possible to reduce the capacitance of such floating diffusion FD, and it is possible to increase the variation width of the potential with respect to the charge stored in such floating diffusion FD.

In such configuration, the CMOS image sensor in the first embodiment has a configuration in which capacitance $C_{FD}$ of floating diffusion FD is smaller than capacitance $C_{PD}$ of photodiode PD. It is also preferred that the sum of capacitance $C_{FD}$ of floating diffusion FD and capacitance $C_S$ of the additive capacitive element be larger than capacitance $C_{PD}$ of the photodiode PD. Also, it is preferred that capacitance $C_{FD}$ of floating diffusion FD be smaller than capacitance $C_S$ of the additive capacitive element. Thus, the following conditions are met:

$$C_{FD} < C_{PD} \tag{1}$$

$$C_{FD} + C_S \geq C_{PD} \tag{2}$$

$$C_{FD} < C_S \tag{3}$$

In this embodiment, for example, the additive capacitive element is formed from the capacitance of an impurity diffusion layer formed on the semiconductor substrate. Even when the additive capacitive element doesn't have a configuration with a pair of electrodes set facing each other via an insulating film, sufficient capacitance still can be realized. Of course, one may also adopt a scheme in which a pair of electrodes are set facing each other via an insulating film.

Figure 3:
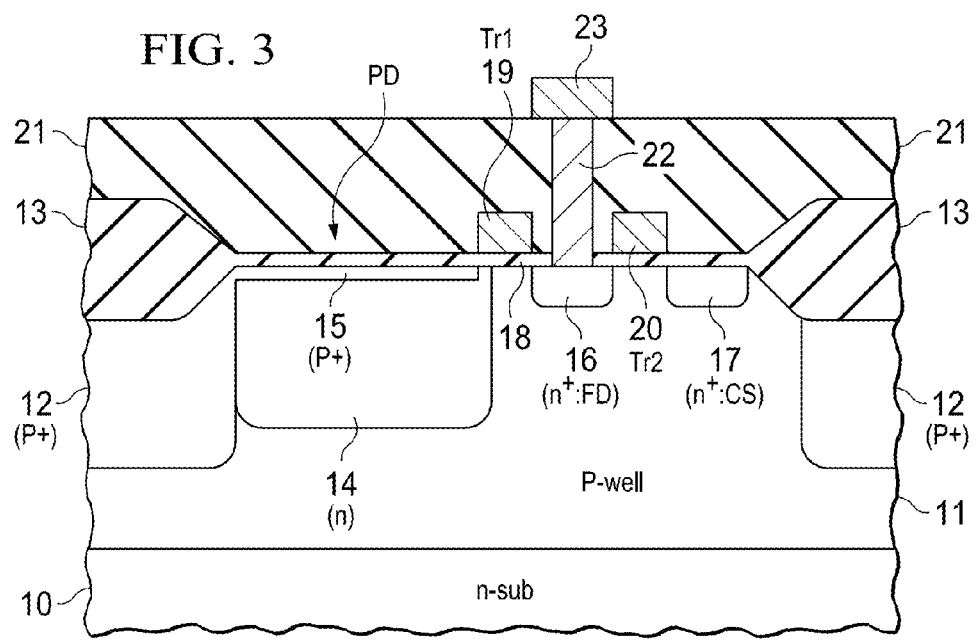
FIG. 3 is a schematic cross-sectional view, taken along the line A-A' in FIG. 2, illustrating a portion of each pixel in the CMOS image sensor of the first embodiment.

FIG. 3 is a schematic cross-sectional view illustrating a portion of each pixel in the CMOS image sensor (photodiode PD, transfer transistor Tr1, floating diffusion FD, capacitive coupling transistor Tr2 and additive capacitive element Cs), and it corresponds to the cross-sectional view taken across A-A' in FIG. 2.

A p-type well 11 (p-well) may be formed, for example, in n-type silicon semiconductor substrate 10 (n-sub), and the various pixels and additive capacitive element Cs regions may be divided from each other by means of $p^+$-type separating region 12 and element separating insulating film 13 formed using a LOCOS method or the like. In p-type well 11, n-type semiconductor region 14 is formed, and, on the outer layer of such n-type semiconductor region, $p^+$-type semiconductor region 15 is formed. By means of the p-n junction, a charge transfer embedding type photodiode PD is formed. At the end portion of n-type semiconductor region 14, a region is formed by protruding $p^+$-type semiconductor region 15, and $n^+$-type semiconductor region 16 as floating diffusion FD is formed on the outer layer of p-type well 11 separated by a prescribed distance from such region. Also, $n^+$-type semiconductor region 17 as additive capacitive element Cs is formed on the outer layer of p-type well 11 separated by a prescribed distance from such region. Here, in the region pertaining to n-type semiconductor region 14 and $n^+$-type semiconductor region 16, on the upper surface of p-type well 11, gate electrode 19 made of polysilicon is formed via gate insulating film 18 made of silicon oxide. Such n-type semiconductor region 14 and $n^+$-type semiconductor region 16 are taken as source/drain, and transfer transistor Tr1 having a channel forming region is formed on the outer layer of p-type well 11. Also, in the region pertaining to $n^+$-type semiconductor region 16 and $n^+$-type semiconductor region 17, gate electrode 20 made of polysilicon is formed via gate insulating film 18 made of silicon oxide formed on the upper surface of p-type well 11, and $n^+$-type semiconductor region 16 and $n^+$-type semiconductor region 17 are taken as source/drain, forming capacitive coupling transistor Tr2 having a channel forming region formed on the outer layer of p-type well 11. Also, insulating film 21 made of silicon oxide or the like is formed to cover such transfer transistor Tr1, capacitive coupling transistor Tr2 and additive capacitive element Cs. An opening is formed to reach $n^+$-type semiconductor region 16, and plug 22 is buried, followed by formation of upper-layer wiring 23. Such upper-layer wiring 23 is connected to the gate electrode (not shown in the FIG.) of amplifying transistor Tr4 in a region not shown in the figure. Here, driving line ϕT is set connected to gate electrode 19 of transfer transistor Tr1, and driving line ϕs is connected to gate electrode 20 of capacitive coupling transistor Tr2. Other such elements, that is, reset transistor Tr3, amplifying transistor Tr4, selecting transistor Tr5, various driving lines of (ϕT, ϕS, ϕR, ϕX) and an output line (out) are formed with the configuration shown in the equivalent circuit in FIG. 1 in a region not shown in FIG. 3 on semiconductor substrate 10.

An explanation is given below regarding the overall circuit configuration of a CMOS image sensor with pixels of such configuration integrated in an array configuration.

Figure 4:
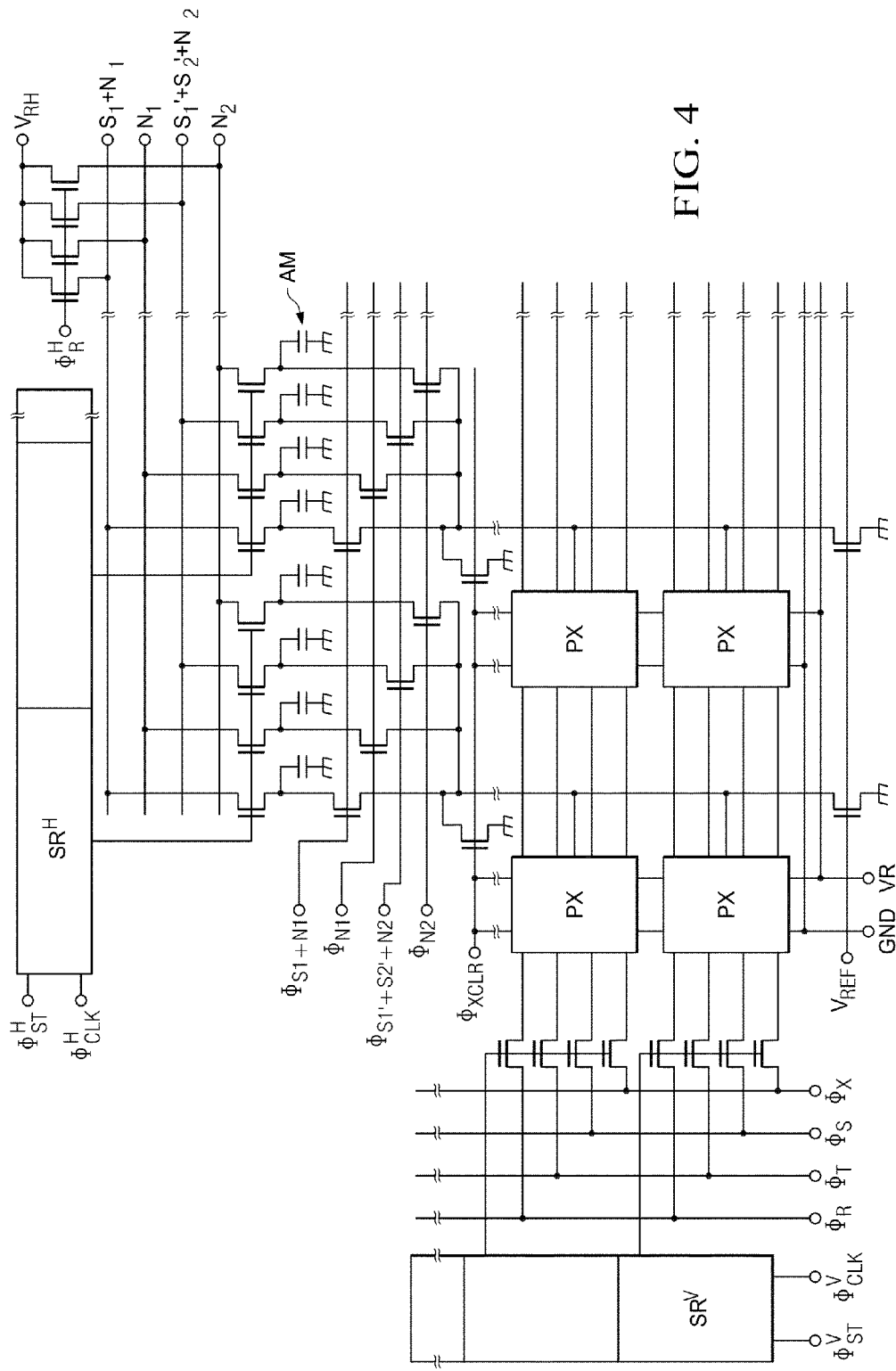
FIG. 4 is an equivalent circuit diagram illustrating the overall circuit configuration of the CMOS image sensor of the first embodiment.

FIG. 4 is a diagram illustrating the equivalent circuit diagram of the overall circuit configuration of the CMOS image sensor in the present embodiment. A plurality (four in this example shown in the figure) of pixels PX are set in an array configuration, and each pixel PX is connected to such driving lines of (ϕT, ϕS, ϕR, ϕX) controlled by row shift register $SR^V$, power source voltage VR and ground GND. Each pixel PX is controlled by column shift register $SR^H$ and driving lines (ϕS1+N1, ϕN1, ϕS1'+S2'+N2, ϕN2), and, as to be explained later, the following signals are output to the various output lines at respective timings from pixel PX and through analog memory AM, which can have its memory cleared by driving line ϕXCLR: pre-saturation charge signal $(S_1)+C_{FD}$ noise $(N_1)$, $C_{FD}$ noise $(N_1)$, modulated pre-saturation charge signal $(S_{1'})$+modulated over-saturation charge signal $(S_{2'})+C_{FD}+C_S$ noise $(N_2)$ and $C_{FD}+C_S$ noise $(N_2)$.

Figure 5:
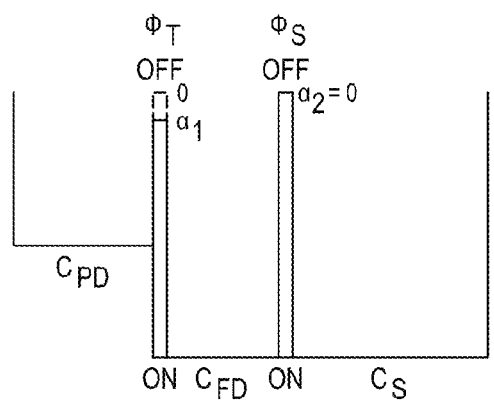
FIG. 5 is a schematic potential diagram illustrating the photodiode, transfer transistor, floating diffusion, capacitive coupling transistor and additive capacitive element in the CMOS image sensor of the first embodiment.

FIG. 5 is a schematic potential diagram illustrating such photodiode PD, transfer transistor Tr1, floating diffusion FD, capacitive coupling transistor Tr2, and additive capacitive element Cs. Such photodiode PD forms capacitance $C_{PD}$ with a relatively shallow potential, and floating diffusion FD and additive capacitive element Cs form capacitances $C_{FD}$, $C_S$ with a relatively deep potential. here, transfer transistor Tr1 and capacitive coupling transistor Tr2 take two levels corresponding to ON/OFF of the transistors according to ϕT and ϕS. For example, as the OFF potential of transfer transistor Tr1, in consideration of overflow from photodiode PD to floating diffusion FD, a prescribed voltage α1 with respect to the voltage applied to the semiconductor substrate is applied. Also, for example, as the OFF potential of capacitive coupling transistor Tr2, prescribed voltage α2 (=0 V) is applied. Also, the same voltage may be applied to α1 and α2 to obtain the same height of potential.

In the following, an explanation will be given regarding the operating method for the CMOS image sensor in the present embodiment with reference to the equivalent circuit diagram shown in FIG. 1 and the potential diagram shown in FIG. 5.

FIG. 6 is a time chart illustrating the voltage applied to driving lines (ϕT, ϕS, ϕR, ϕX) with the two levels of ON/OFF, and the voltage applied to such driving lines (ϕS1+ϕN1, ϕN1, ϕS1'+S2'+N2, ϕN2).

In the following, an explanation will be given regarding control of the potential shown in FIG. 5 according to the time chart shown in FIG. 6.

Figure 7A:
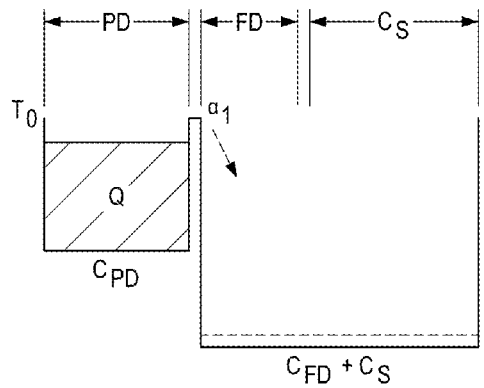
FIGS. 7(A)-(H) are schematic potential diagrams illustrating the photodiode-additive capacitive element of the CMOS image sensor of the first embodiment.

FIGS. 7(A)-(H) correspond to the potential diagrams at the various timings of the time chart. First, photoelectric charge Q is stored in $C_{PD}$ during the storage period of one field. As shown in FIG. 7(A), during the storage period, ϕs and ϕR are turned ON, $C_{FD}$ and $C_S$ are coupled, and power source voltage VR is applied in this state. As ϕT becomes level α1, in the potential made of $C_{FD}+C_S$, the photoelectric charge that overflowed from $C_{PD}$ during the storage period is exhausted to power source voltage VR. Then, at the time immediately after completion of output period $P_{OP}$ of the preceding line, driving lines (ϕS1+N1, ϕN1, ϕS1'+S2'+N2, ϕN2) are turned ON, and, at the same time, driving line ϕXCLR is turned ON, and analog memory AM shown in FIG. 4 is cleared.

Figure 7B:
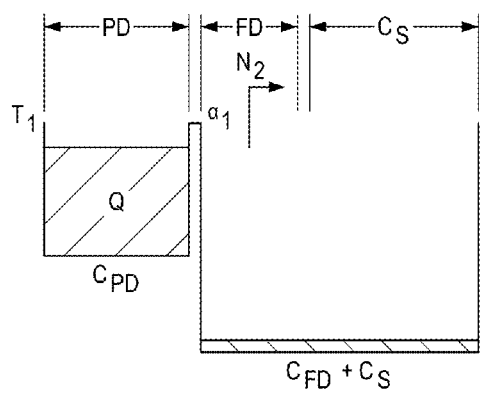

Then, as shown in FIG. 7(B), after completion of output period $P_{OP}$ of the preceding line, and at time $T_1$ when horizontal blanking period $P_{HB}$ of the current line starts, ϕX is turned ON, and ϕR is turned OFF. When ϕR is turned OFF, so-called kTC noise is generated in the potential arranged of $C_{FD}+C_S$. Here, as shown in FIG. 4, ϕN2 is turned ON, and the signal of the reset level of $C_{FD}+C_S$ is read as noise $N_2$.

Figure 7C:
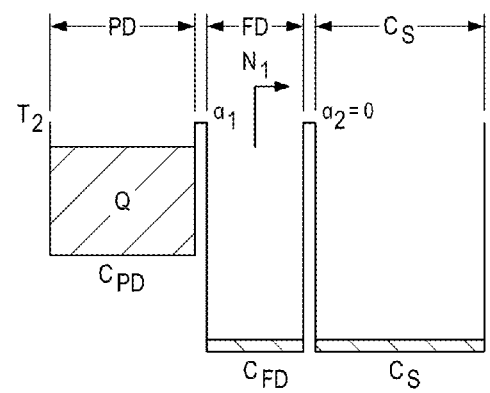

Then, as shown in FIG. 7(C), at time $T_2$, ϕS is turned OFF (α2). When ϕs is turned OFF, the potential composed of $C_{FD}+C_S$ is divided into the potential of $C_{FD}$ and potential $C_S$.

Here, as shown in FIG. 4, φN1 is turned ON, and the signal of the reset level of $C_{FD}$ is read as noise $N_1$.

Figure 7D:
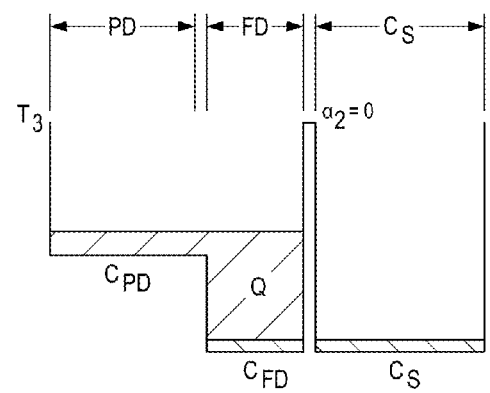

Then, at time $T_3$, as shown in FIG. 7(D), φT is turned ON, and a portion or the entirety of photoelectric charge Q stored in $C_{PD}$ is transferred to $C_{FD}$. Here, in the present embodiment, as explained above, because the design is such that $C_{FD} < C_{PD}$, and the entirety of the stored photoelectric charge may overrun the capacity of $C_{FD}$. FIG. 7D shows the case in which photoelectric charge Q stored in $C_{PD}$ exceeds the capacity of $C_{FD}$. Consequently, it is impossible to transfer the entirety of photoelectric charge Q. Instead, only a portion of the charge is transferred, while the residual portion is left in $C_{PD}$.

Figure 7E:
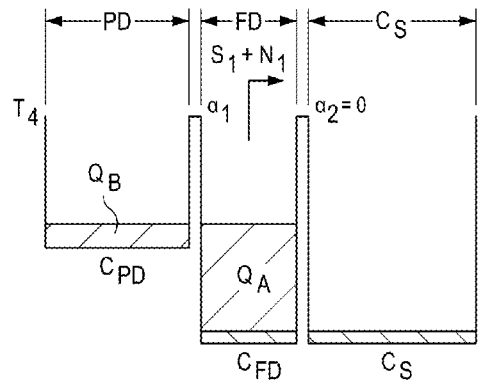

Then, as shown in FIG. 7(E), at time $T_4$, while such residual portion is left in $C_{FD}$, φT is set back to the OFF state (α1). As a result, photoelectric charge Q is divided into portion $Q_A$ transferred to $C_{FD}$ and residual portion $Q_B$ left in $C_{PD}$. Here, assuming that φS1+N1 in FIG. 4 is ON, as the first signal, signal $S_1$ corresponding to such portion $Q_A$ of the photoelectric charge transferred to $C_{FD}$ is read. Here, as to be explained later, when the entirety of the photoelectric charge does not reach the quantity that saturates $C_{FD}$, the signal read in this case is adopted as the output of such pixel. Consequently, this signal is also called a pre-saturation charge signal. In FIG. 7(E), $C_{FD}$ is saturated with the entirety of the photoelectric charge. As explained above, portion $Q_A$ of the photoelectric charge and a charge corresponding to noise $N_1$ are present in $C_{FD}$, and $S_1+N_1$ is actually read out.

Figure 7G:
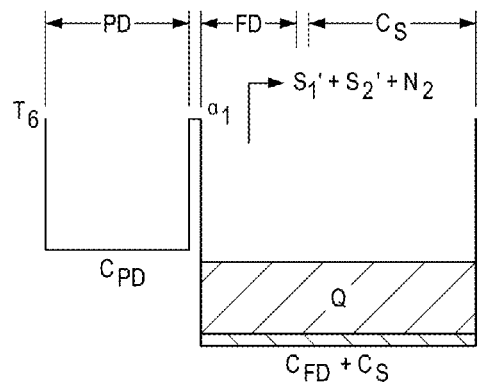
Figure 7F:
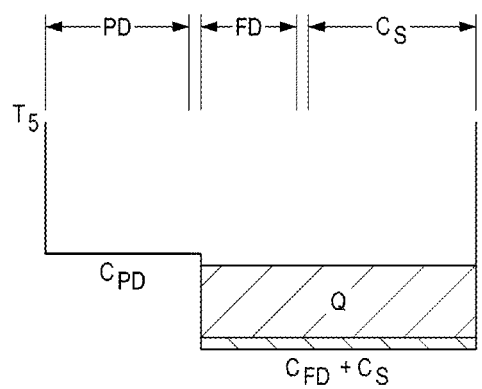

Then, as shown in FIG. 7(F), at time $T_5$, φS is turned ON, and φT is turned ON. As a result, $C_{FD}$ and $C_S$ are combined to form the potential, and the entirety of photoelectric charge Q stored in $C_{PD}$ is transferred to $C_{FD}+C_S$. In the present embodiment, the design is such that $C_{FD}+C_S \geq C_{PD}$. Consequently, even when the entirety of the stored photoelectric charge is transferred, it still does not overflow $C_{FD}+C_S$. Also, the potential of $C_{PD}$ is shallower than that of $C_{FD}+C_S$, and the level of the transfer transistor is deeper than that of $C_{PD}$, so the entirety of photoelectric charge Q in $C_{PD}$ is transferred to $C_{FD}+C_S$, that is, the charge can be fully transferred.

Then, at time $T_6$, as shown in FIG. 7(G), φT is reset OFF (α1). Here, as shown in FIG. 4, φS1'+S2'+N2 is turned ON, and, as a second signal, the signal $S_1+S_2$ corresponding to the entirety of photoelectric charge Q transferred to $C_{FD}+C_S$ is read. Here, because over-saturated charge signal $S_2$ as the signal of the portion over $C_{FD}$ is sufficient with respect to such pre-saturation charge signal $S_1$, the signal read out in this case is denoted as signal $S_1+S_2$. Here, because noise $C_{FD}+C_S$ rises on it, and read is made from the charge extending to $C_{FD}+C_S$, $S_{1'}+S_{2'}+N_2$ is actually read out (here, $S_{1'}$ and $S_{2'}$ refer to values of $S_1$ and $S_2$ that are modulated to be smaller depending on the ratio between capacitances $C_{FD}$ and $C_S$).

Figure 7H:
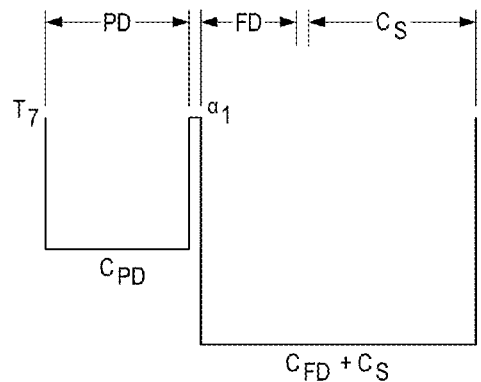

Then, as shown in FIG. 7(H), at time $T_7$ of completion of horizontal blanking period $P_{HB}$ of such line, φX is turned OFF, φR is turned ON, and the photoelectric charge in the potential composed of $C_{FD}+C_S$ is exhausted. The period from time $T_7$ of completion of such horizontal blanking period $P_{HB}$ to time $T_8$ is taken as such line output period $P_{OP}$. During this output period, pre-saturation charge signal $(S_1)+C_{FD}$ noise $(N_1)$, $C_{FD}$ noise $(N_1)$, modulated pre-saturation charge signal $(S_{1'})$+modulated over-saturated charge signal $(S_{2'})+C_{FD}+C_S$ noise $(N_2)$ and $C_{FD}+C_S$ noise $(N_2)$ are output to the various output lines at their respective timing.

As shown in FIGS. 7(A)-(H), the following signals are output when photoelectric charge Q stored in $C_{PD}$ exceeds $C_{FD}$ and when photoelectric charge Q stored in $C_{PD}$ does not exceed $C_{FD}$, respectively.

Figure 8A:
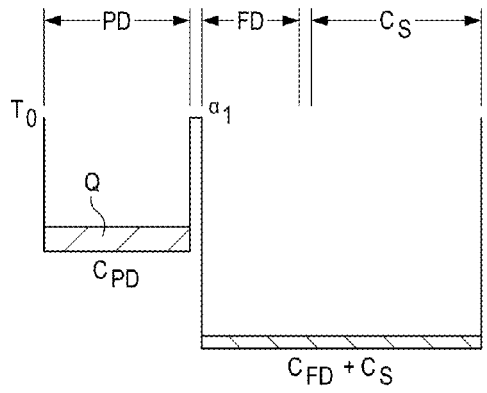
FIGS. 8(A)-(H) are schematic potential diagrams illustrating the photodiode-additive capacitive element of the CMOS image sensor of the first embodiment n.
Figure 8B:
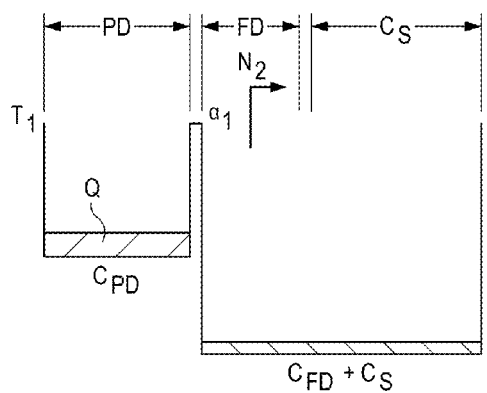
Figure 8C:
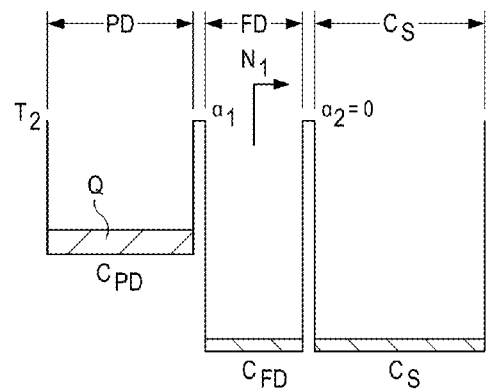
Figure 8D:
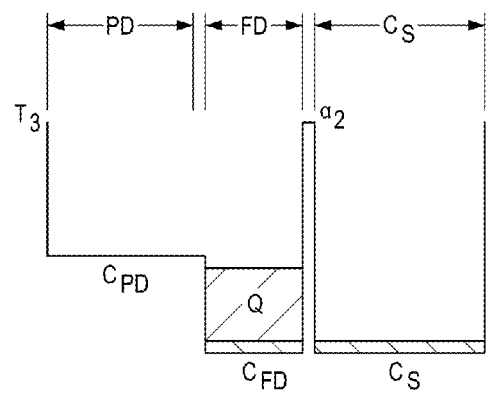
Figure 8E:
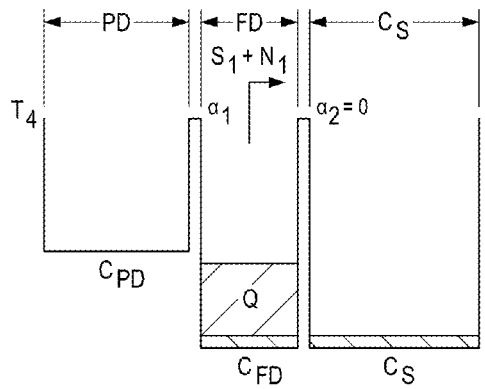
Figure 8G:
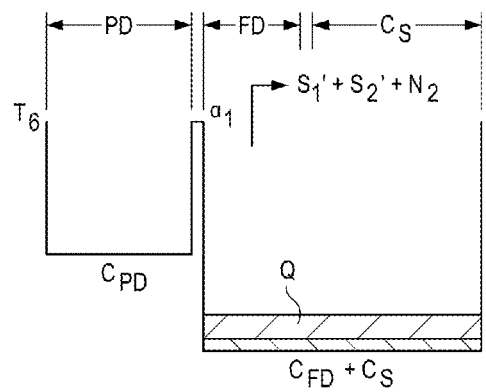
Figure 8F:
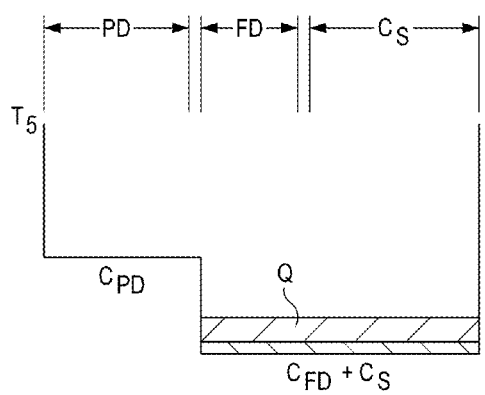
Figure 8H:
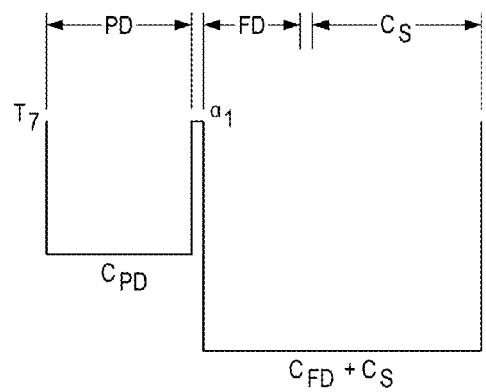

FIGS. 8(A)-(H) are potential diagrams at the various time points of the time chart when photoelectric charge Q stored in $C_{PD}$ does not exceed $C_{FD}$. First of all, during the storage period of 1 field, photoelectric charge Q is stored in $C_{PD}$, and, as shown in FIG. 8(A), φX is turned OFF, φT is turned OFF (α1), φS is turned ON, φR is turned ON, and the photoelectric charge in the potential composed of $C_{FD}+C_S$ is exhausted. Then, immediately after completion of output period $P_{OP}$ of the preceding line, after analog memory AM shown in FIG. 4 is cleared, as shown in FIG. 8(B), at time $T_1$, φX is turned ON, φR is turned OFF, and the signal of the reset level of $C_{FD}+C_S$ is read as noise $N_2$. Then, at time $T_2$, as shown in FIG. 8(C), φS is turned OFF (α2), and the signal of the reset level of $C_{FD}$ is read as noise $N_1$. Then, at time $T_3$, as shown in FIG. 8(D), φT is turned ON, and the entirety of photoelectric charge Q stored in $C_{PD}$ is transferred to $C_{FD}$. As explained above, when photoelectric charge Q stored in $C_{PD}$ does not exceed $C_{FD}$, the entirety of photoelectric charge Q is transferred to $C_{FD}$. Then, at time $T_4$, as shown in FIG. 8(E), φT is turned OFF again (α1), and, as the first signal, pre-saturation charge signal $S_1$ corresponding to the entirety of photoelectric charge Q transferred to $C_{FD}$ is read. As explained above, $S_1+N_1$ is actually read. Then, at time $T_5$, as shown in FIG. 8(F), φS is turned ON, and then φT is turned ON, and a potential as a combination of $C_{FD}$ and $C_S$ is obtained. Then, at time $T_6$, as shown in FIG. 8(G), φT is turned OFF again (α1), and, as the second signal, signal $S_1+S_2$ corresponding to the entirety of photoelectric charge Q transferred to $C_{FD}+C_S$ is read. Here, $S_{1'}+S_{2'}+N_2$ is actually read (here, $S_{1'}$ and $S_{2'}$ refer to values of $S_1$ and $S_2$ that have been modulated to be contracted according to the capacitance ratio of $C_{FD}$ to $C_S$). Then, at time $T_7$, as shown in FIG. 8(H), (φX is turned OFF, φR is turned ON, and the photoelectric charge in the potential composed of $C_{FD}+C_S$ is exhausted.

As explained above, both when photoelectric charge Q stored in $C_{PD}$ exceeds and does not exceed $C_{FD}$, signals of pre-saturation charge signal $(S_1)+C_{FD}$ noise $(N_1)$, $C_{FD}$ noise $(N_1)$, modulated pre-saturation charge signal. $(S_{1'})$+modulated over-saturated charge signal $(S_{2'})+C_{FD}+C_S$ noise $(N_2)$, and $C_{FD}+C_S$ noise $(N_2)$ are read, and, from the various signals, the output of such pixel is obtained as follows. That is, from such output, pre-saturation charge signal $(S_1)+C_{FD}$ noise $(N_1)$ and $C_{FD}$ noise. $(N_1)$ are input to a differential amplifier or the like to get the difference so as to cancel $C_{FD}$ noise $(N_1)$ to obtain pre-saturation charge signal $(S_1)$. On the other hand, modulated pre-saturation charge signal $(S_{1'})$+ modulated over-saturated charge signal $(S_{2'})+C_{FD}+C_S$ noise $(N_2)$ and $C_{FD}+C_S$ noise $(N_2)$ are input to a differential amplifier or the like to obtain the difference so as to cancel $C_{FD}+C_S$ noise $(N_2)$. Then, an amplifier or the like is used for recovery according to the capacitance ratio of $C_{FD}$ to $C_S$, and the gain is adjusted to that of pre-saturation charge signal $(S_1)$, obtaining the sum of the pre-saturation charge signal and over-saturated charge signal $(S_1+S_2)$.

In the following, an explanation will be given regarding recovery of such modulated pre-saturation charge signal $(S_{1'})$+modulated over-saturation charge signal $(S_{2'})$. Here, $S_{1'}$, $S_{2'}$, and α (charge distribution ratio of $C_{FD}$ to $C_{FD}+C_S$) are represented by the following numerical formula:

$$S_{1'} = S_1 \times \alpha \qquad (4)$$

$$S_{2'} = S_2 \times \alpha \qquad (5)$$

$$\alpha' = C_{FD}/(C_{FD}+C_S) \qquad (6)$$

Consequently, from the values of $C_{FD}$ and $C_S$, α is determined using such formula 6, and, by substituting the result into such formula 4 and formula 5, it is possible to reset to $S_1+S_2$, and it is possible to adjust to the same gain as $S_1$ that has been obtained separately. Then, one of such obtained $S_1$ and $S_1+S_2$ is selected as the final output. Here, for example, when the first signal (pre-saturation charge signal ($S_1$)) is lower than the saturated signal of floating diffusion $C_{FD}$, such first signal is taken as the output of such pixel, and, when such first signal (pre-saturation charge signal ($S_1$)) exceeds the saturated signal of floating diffusion $C_{FD}$, the second signal (pre-saturation charge signal ($S_1$)+over-saturated charge signal ($S_2$)) is taken as the output of such pixel. For example, the selection of such first signal (pre-saturation charge signal ($S_1$)) and second signal (pre-saturation charge signal ($S_1$)+over-saturated charge signal ($S_2$)) may be performed by inputting $S_1$ into a comparator with such reference potential set there, and, by means of the comparison result, a selector or the like is used to select $S_1$ or $S_1+S_2$.

In a CMOS image sensor with such configuration, the portion up to $S_1$ or $S_1+S_2$ may be formed on the CMOS image sensor, or a circuit of a differential amplifier or the like with the portion until the output of pre-saturation charge signal ($S_1$)+$C_{FD}$ noise ($N_1$), $C_{FD}$ noise ($N_1$), modulated pre-saturation charge signal ($S_1$)+modulated over-saturation charge signal ($S_2$)+$C_{FD}$+$C_S$ noise ($N_2$), and $C_{FD}$+$C_S$ noise ($N_2$) formed on the CMOS image sensor chip may be set out of the chip. For the CMOS image sensor of the present embodiment, capacitance $C_{FD}$ of floating diffusion FD is smaller than capacitance $C_{PD}$ of photodiode PD ($C_{FD}<C_{PD}$), so the first signal (pre-satutation charge signal ($S_1$)) is obtained by means of only the signal of the smaller $C_{FD}$, and it is possible to realize higher sensitivity and a higher S/N ratio of the signal in the low-luminance region. In addition, because the sum of capacitance $C_{FD}$ of floating diffusion FD and capacitance $C_S$ of the additive capacitive element exceeds capacitance $C_{PD}$ of photodiode PD ($C_{FD}+C_S \geq C_{PD}$), the second signal (pre-saturation charge signal ($S_1$)+over-saturated charge signal ($S_2$)) is obtained. As a result, in addition to such low-luminance region, the high-luminance region corresponding to the saturated quantity of capacitance $C_{PD}$ of photodiode PD also can obtain a signal at high sensitivity, and a wider dynamic range can be realized. In particular, by capacitance $C_{FD}$ of floating diffusion FD being smaller than capacitance $C_S$ of the additive capacitive element ($C_{FD}<C_S$), it is possible to further increase the sensitivity of the low-luminance region. For example, by selecting $C_{FD}$ to be 0.4 fF so as to be capable to detect a single electron, and selecting $C_{FD}:C_S$ to be 1:7, it is possible to obtain a high sensitivity signal in the illumination region up to about 3-4 fF of $C_{PD}$.

Figure 9A:
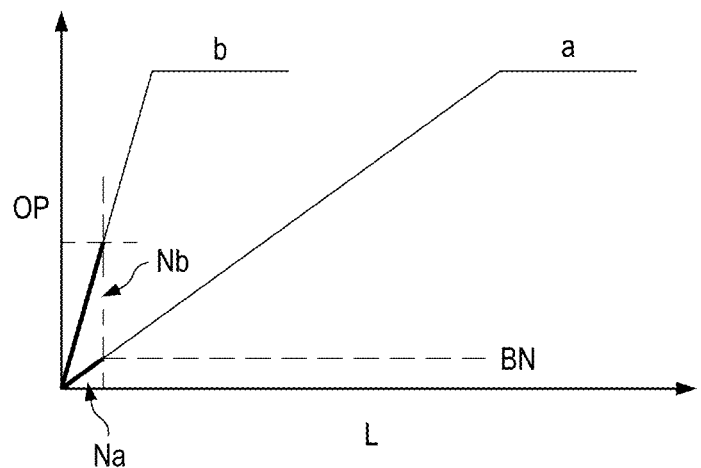
FIGS. 9(A) and (B) are schematic diagrams illustrating the gain-up and noise characteristics for illustrating the higher sensitivity and higher S/N ratio in the low-luminance region of the CMOS image sensor of the first embodiment.

FIGS. 9(A) and (B) are schematic diagrams illustrating the gain-up and noise characteristics for explaining an increase in sensitivity and the S/N ratio for the low-luminance region of the CMOS image sensor in the present embodiment. In this figure, the abscissa represents the input light quantity L, and the ordinate represents the output OP. FIG. 9(A) shows the gain-up and noise characteristics of a CMOS image sensor corresponding to the prior art. It shows that noise Na until the level of fundamental floor noise BN rides on fundamental output (a). When electric amplification is performed in the low-luminance region by an amplifier set in the output latter stage with respect to fundamental output (a), gain-up output (b) is obtained, and noise Na becomes a signal having amplified noise Nb riding on it.

Figure 9B:
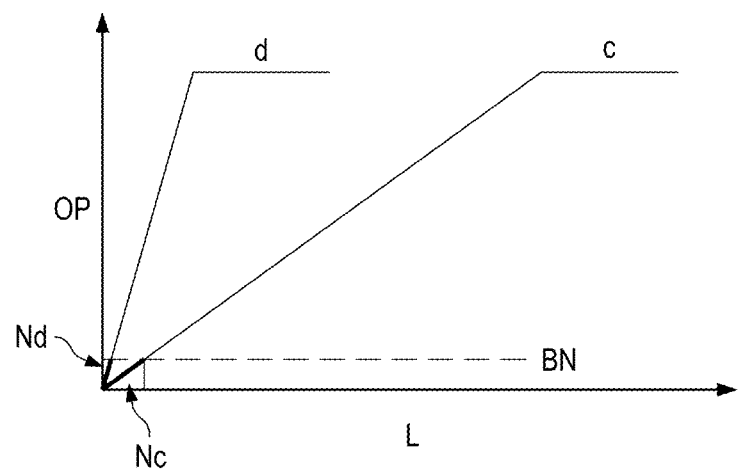

On the other hand, FIG. 9(B) shows the gain-up and noise characteristics of the CMOS image sensor in the present embodiment, and output (c) of the second signal (pre-saturation charge signal ($S_1$)+over-saturated charge signal ($S_2$)) that can correspond until high luminance and output (d) of the first signal (pre-saturation charge signal ($S_1$)) that can increase the sensitivity of the low-luminance region can be obtained. Both signals have noise Nc, Nd until the level of fundamental floor noise BN rides on them. However, since noise Nd of output (d) of the first signal (pre-saturation charge signal ($S_1$)) is not noise which Nc has amplified, it is possible to realize higher sensitivity and a higher S/N ratio for a signal corresponding to the low-luminance region.

As explained above, for the CMOS image sensor of the present embodiment, it is possible to realize higher sensitivity and a higher S/N ratio especially in the low-luminance region while maintaining a wide dynamic range. Also, according to the operating method for the CMOS image sensor of the present embodiment, the solid-state image pickup device can operate such that higher sensitivity and a higher S/N ratio especially in the low-luminance region can be realized while a wide dynamic range is maintained.

Second Embodiment

Figure 10:
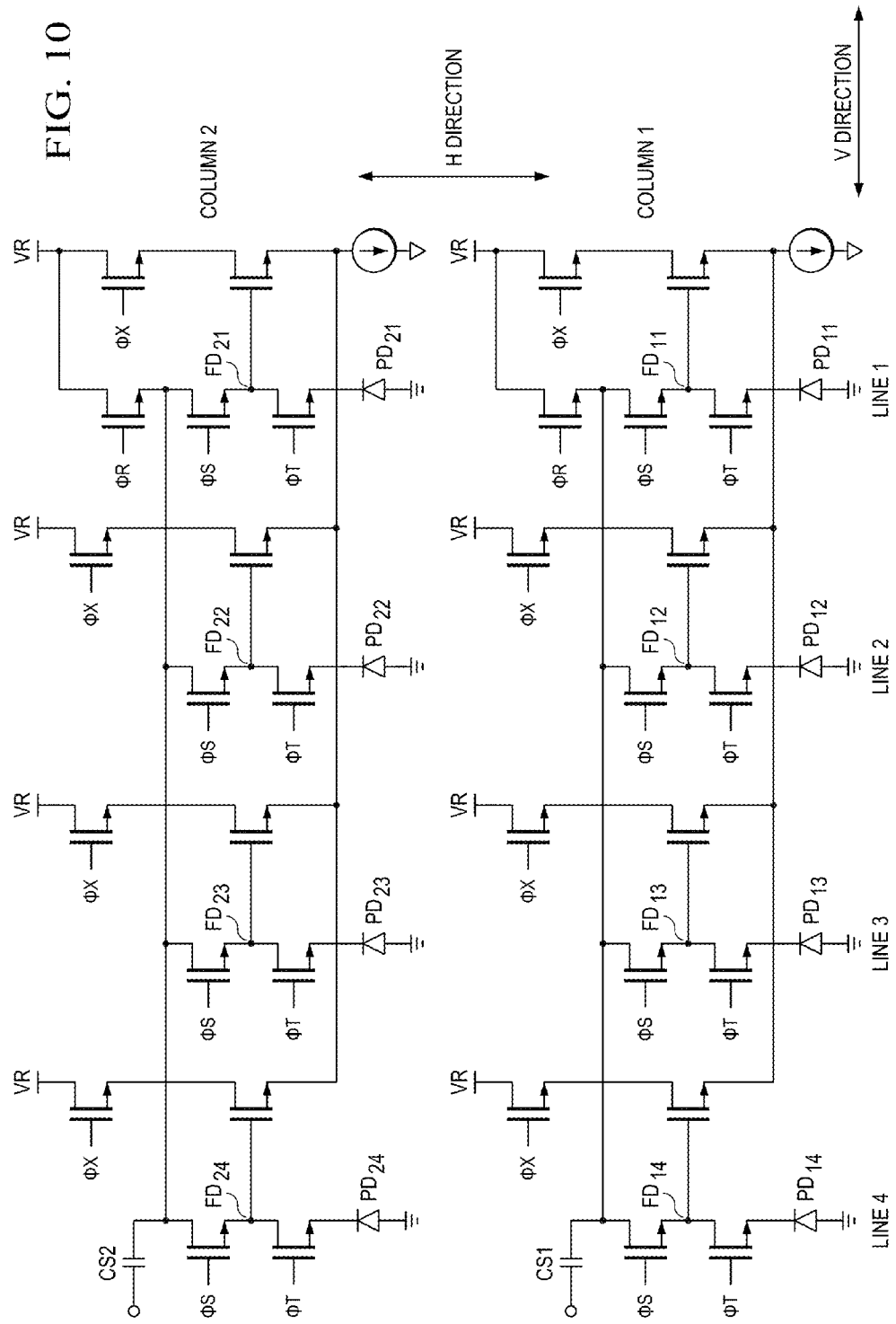
FIG. 10 is an equivalent circuit diagram illustrating a portion of 8 pixels in the CMOS image sensor in the solid-state image pickup device according to a second embodiment.

FIG. 10 is an equivalent circuit diagram illustrating a portion of eight pixels of a CMOS image sensor as the solid-state image pickup device in a second embodiment. While the CMOS image sensor in the first embodiment is a so-called five-transistor type CMOS image sensor having five transistors for each pixel: a transfer transistor, capacitive coupling transistor, reset transistor, amplifying transistor (source follower), and selecting transistor Tr5, the present embodiment has a configuration in which the reset transistor and additive capacitive element are shared by four pixels adjacent to each other in the vertical direction (V direction).

As shown in FIG. 10, in the vertical direction (V direction), lines 1-4 are set side-by-side, and, in the horizontal direction, columns 1-2 are set side-by-side. Eight pixels are set in this configuration. Pixels have photodiodes $PD_{11}$-$PD_{14}$, $PD_{21}$-$PD_{24}$, and floating diffusions $FD_{11}$-$FD_{14}$, $FD_{21}$-$FD_{24}$, respectively. Also, transfer transistor T, capacitive coupling transistor S, an amplifying transistor (source follower) and selecting transistor X are set for each pixel. Here, the four pixels adjacent to each other in the vertical direction (V direction) share reset transistor R and additive capacitive, elements $Cs_1$, $Cs_2$. The other features of the circuit configuration and the operating method for the read operation are the same as those in first embodiment. In this case, because reset transistor R and additive capacitive elements $Cs_1$, $Cs_2$ are used only during the period of horizontal blanking, by shifting the horizontal blanking period for each line, it is possible to realize sharing of such reset transistor R and additive capacitive elements $Cs_1$, $Cs_2$.

Figure 11:
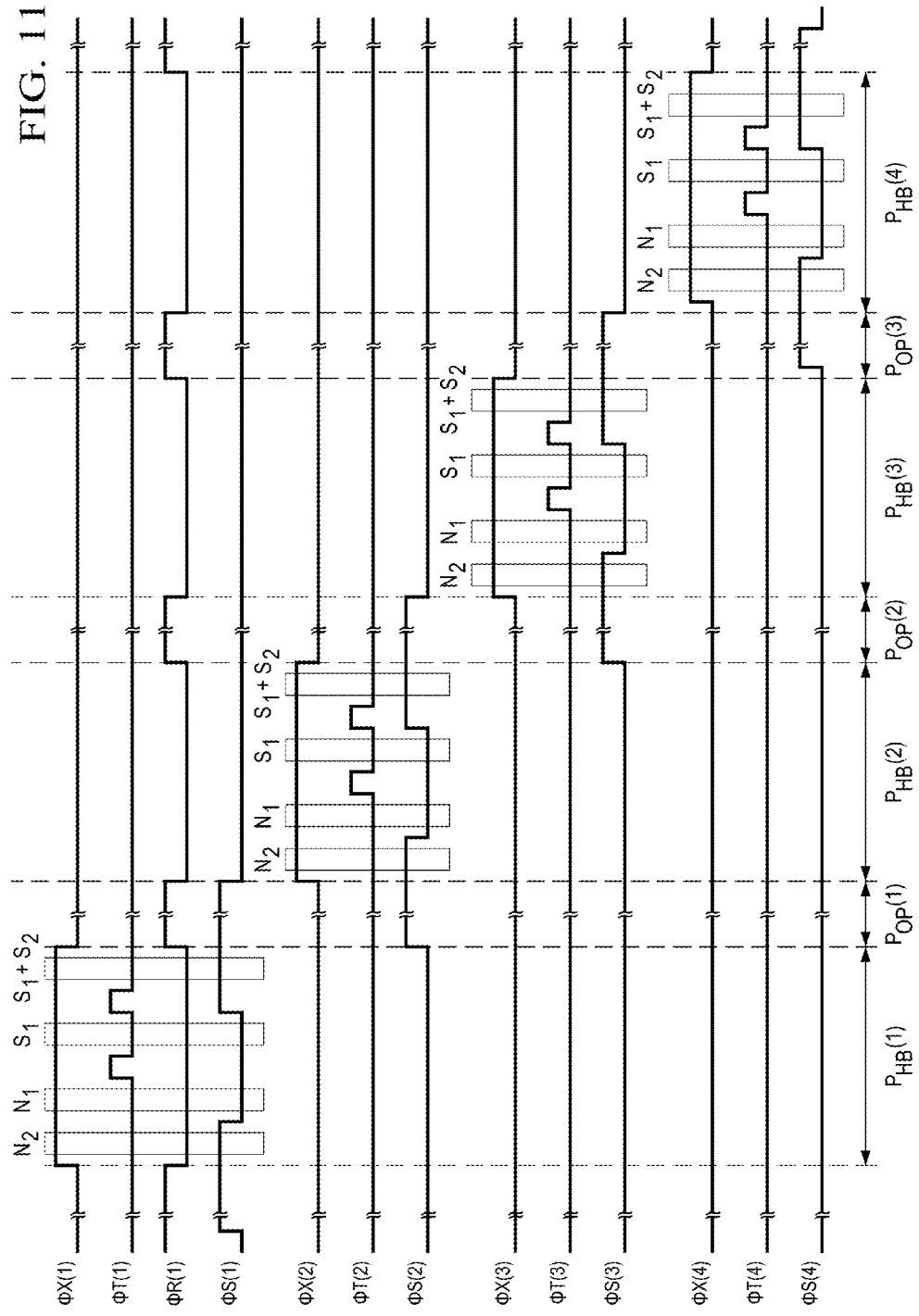
FIG. 11 is a time chart illustrating the operating method for the CMOS image sensor of the second embodiment.

FIG. 11 is a time chart illustrating the operating method for the CMOS image sensor pertaining to the present embodiment. First of all, in horizontal blanking period $P_{HB}1$ of line 1 after completion of the period of storage in line 1, from each pixel of line 1, the following signals are read just as in Embodiment 1: pre-saturation charge signal ($S_1$)+$C_{FD}$ noise ($N_1$), $C_{FD}$ noise ($N_1$), modulated pre-saturation charge signal ($S_1$)+modulated over-saturation charge signal ($S_2$)+$C_{FD}$+$C_S$ noise ($N_2$), and $C_{FD}$+$C_S$ noise ($N_2$). Such signals are output in the output period $P_{OP}1$ of line 1, and, for each pixel of line 1, the first signal (pre-saturation charge signal ($S_1$)) or the second signal (pre-saturation charge signal ($S_1$)+over-saturated charge signal ($S_2$)) is output. Shifted to after output period $P_{OP}1$ of line 1, horizontal blanking period $P_{HB}2$ of line 2 is set, and such signals are read from line 2, and they are output during output period $P_{OP}2$ of line 2. Then, similarly, shifted to after output period $P_{OP}2$, horizontal blanking period $P_{HB}3$ of line 3 is set, the various signals are read from each pixel of line 3, and they are output in output period $P_{OP}3$ of line 3. Then, shifted to after output period $P_{OP}3$, horizontal blanking period $P_{HB}4$ of line 4 is set, the various signals are read from each pixel of line 4, and they are output in output period $P_{OP}4$ of line 4.

In the CMOS image sensor of the second embodiment, there are 17 transistors for every four pixels. Consequently, the number per pixel can be cut to 4.25. Also, since such pixels share, the area of the photodiodes can be increased corresponding to the reduction in the area of the transistors, so the sensitivity can be increased. Just as in the first embodiment, for the CMOS image sensor of the second embodiment, it is possible to realize high sensitivity and a high S/N ratio especially in the low-luminance region, while maintaining a wide dynamic range. Just as in the first embodiment, for the operating method of the CMOS image sensor in the second embodiment, the solid-state image pickup device can operate such that high sensitivity and a high S/N ratio can be realized especially in the low-luminance region, while a wide dynamic range is maintained.

Third Embodiment

Figure 12:
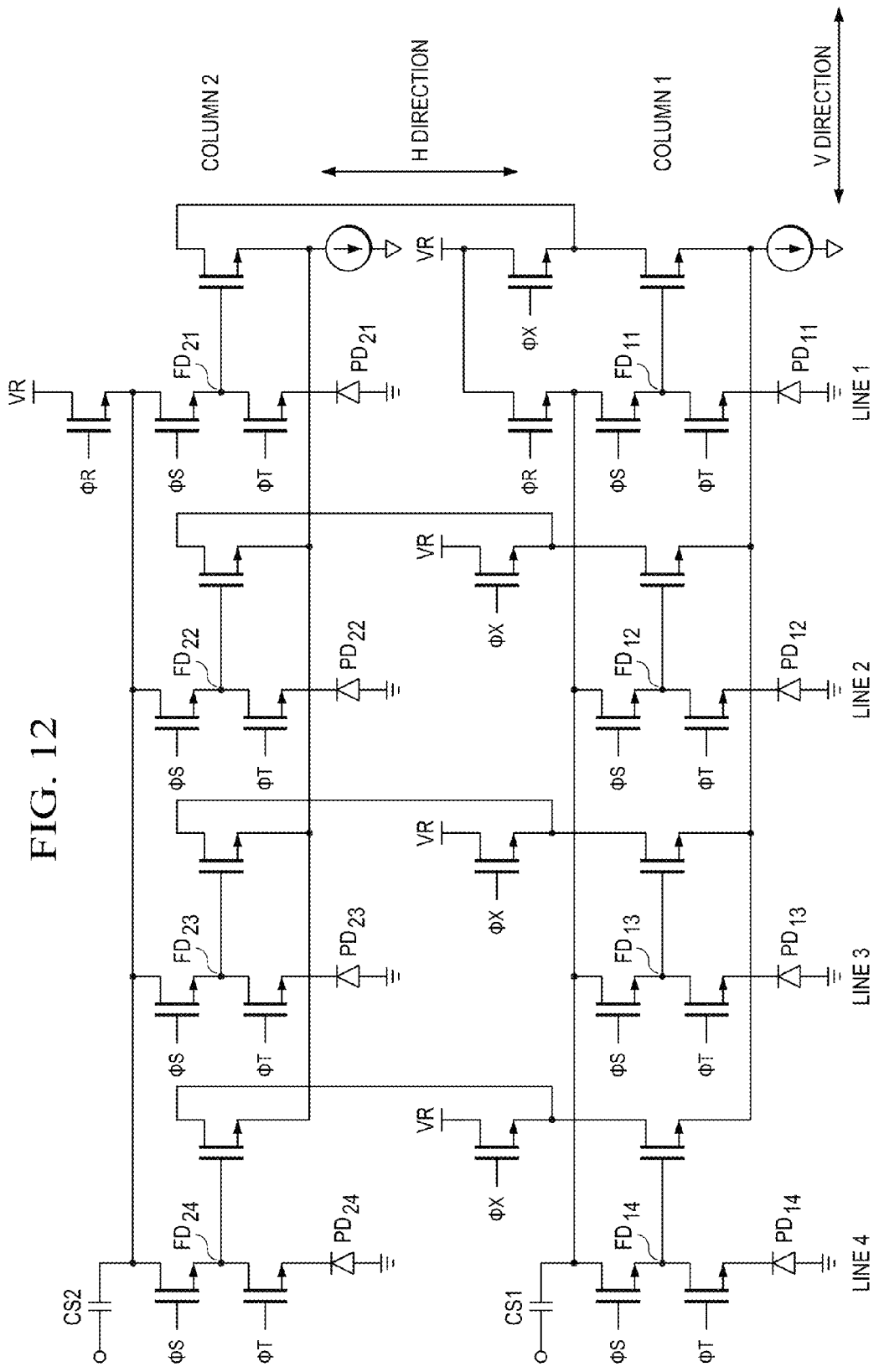
FIG. 12 is an equivalent circuit diagram illustrating a portion of 8 pixels in the CMOS image sensor in the solid-state image pickup device according to a third embodiment.

FIG. 12 is an equivalent circuit diagram illustrating a portion of eight pixels of a CMOS image sensor as the solid-state image pickup device of a third embodiment. Just as in the second embodiment, the reset transistor and the additive capacitive element are shared by four pixels that are adjacent in the vertical direction (V direction), and, in addition, the selecting transistor is shared by two pixels that are adjacent in the horizontal direction (H direction).

As shown in FIG. 12, in the vertical direction (V direction), lines 1-4 are set side-by-side, and, in the horizontal direction, columns 1-2 are set side-by-side. Eight pixels are set in this configuration. The pixels have photodiodes $PD_{11}$-$PD_{14}$, $PD_{21}$-$PD_{24}$, and floating diffusions $FD_{11}$-$FD_{14}$, $FD_{21}$-$FD_{24}$, respectively. Also, transfer transistor T, capacitive coupling transistor S, and an amplifying transistor (source follower) are set for each pixel. Here, the four pixels adjacent to each other in the vertical direction (V direction) share reset transistor R and additive capacitive elements $Cs_1$, $Cs_2$. In addition, for the two pixels adjacent (in the H direction), selecting transistor X is shared by the two pixels adjacent in the horizontal direction (the H direction). The other features of the circuit configuration and the operating method for the read operation are the same as those in the first embodiment.

The CMOS image sensor of the third embodiment can be driven using the same operating method as that in the second embodiment. In the CMOS image sensor of the third embodiment, there are 30 transistors for every eight pixels. Consequently, the number per pixel can be cut to 3.75. Just as in the first embodiment, for the CMOS image sensor of the third embodiment, it is possible to realize high sensitivity and a high S/N ratio especially in the low-luminance region, while maintaining a wide dynamic range. Also, just as in the first embodiment, for the operating method for the CMOS image sensor in the third embodiment, the solid-state image pickup device can operate such that high sensitivity and a high S/N ratio can be realized especially in the low-luminance region, while a wide dynamic range is maintained.

Fourth Embodiment

Figure 13:
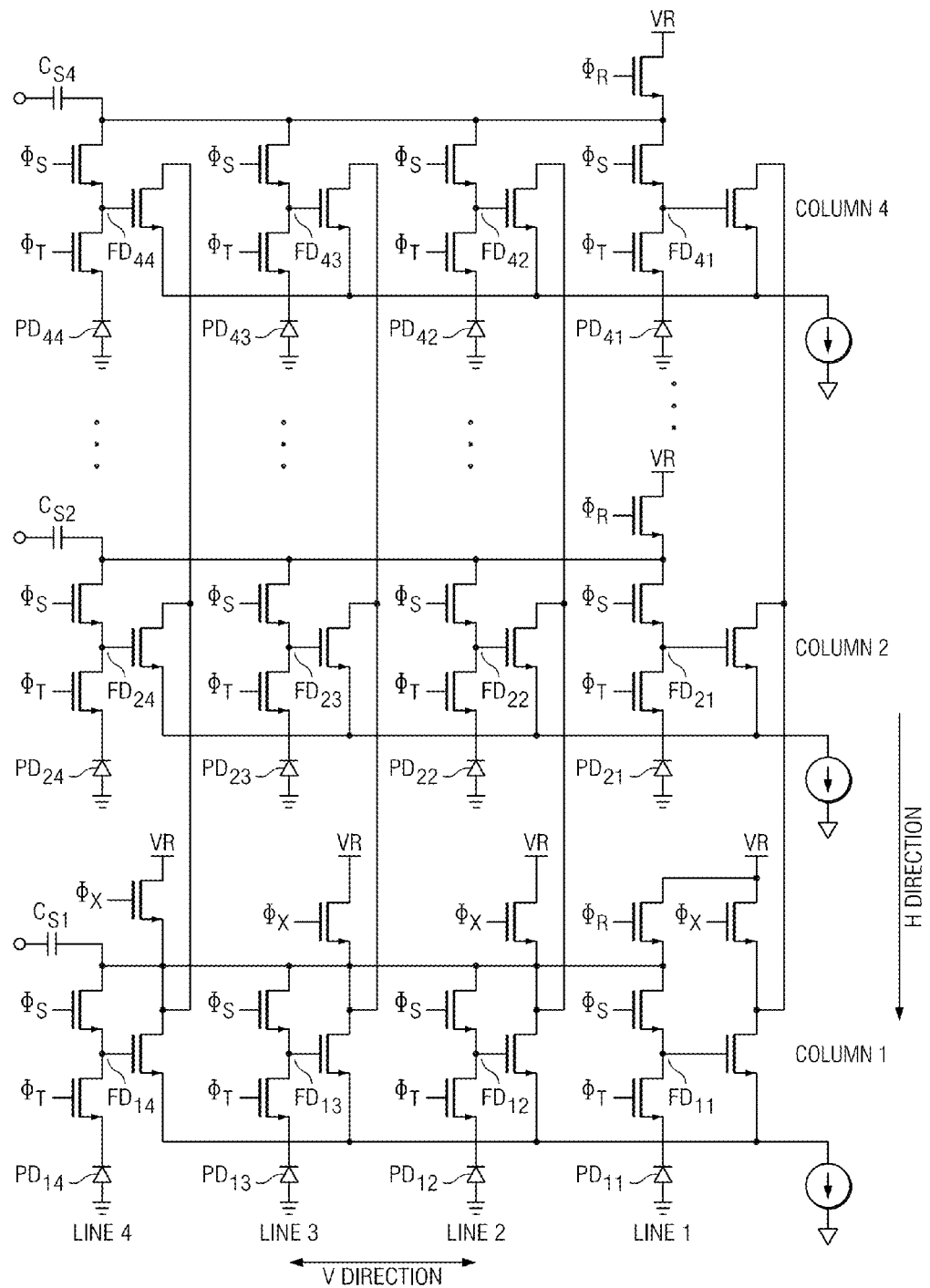
FIG. 13 is an equivalent circuit diagram illustrating a portion of 16 pixels in the CMOS image sensor in the solid-state image pickup device according to a fourth embodiment.

FIG. 13 is an equivalent circuit diagram illustrating a portion of 16 pixels of a CMOS image sensor as the solid-state image pickup device in a fourth embodiment. Just as in the second embodiment, the reset transistor and the additive capacitive element are shared by four pixels that are adjacent in the vertical direction (the V direction), and, in addition, the selecting transistor is shared by four pixels that are adjacent in the horizontal direction (the H direction). As shown in FIG. 13, in the vertical direction (the V direction), lines 1-4 are set side-by-side, and, in the horizontal direction, columns 1-4 are set side-by-side. As a result, 16 pixels are set in this configuration. The pixels have photodiodes $PD_{11}$-$PD_{14}$, $PD_{21}$-$PD_{24}$, ... $PD_{41}$-$PD_{44}$ and floating diffusions $FD_{11}$-$FD_{14}$, $FD_{21}$-$FD_{24}$, ... $FD_{41}$-$FD_{44}$, respectively. Also, transfer transistor T, capacitive coupling transistor S, and an amplifying transistor (source follower) are set for each pixel. Here, the four pixels adjacent to each other in the vertical direction (the V direction) share reset transistor R and additive capacitive elements $CS_1$-$CS_4$. In addition, for the 4 pixels adjacent (in the H direction), selecting transistor X is shared. The other features of the circuit configuration and the operating method for the read operation are the same as those in the first embodiment. The CMOS image sensor of the fourth embodiment can be driven using the same operating method as that in the second embodiment. In the CMOS image sensor of the fourth embodiment, there are 56 transistors for every 16 pixels. Consequently, the number per pixel can be cut to 3.5. Just as in the first embodiment, for the CMOS image sensor of the fourth embodiment, it is possible to realize high sensitivity and a high S/N ratio especially in the low-luminance region, while maintaining a wide dynamic range. Also, just as in the first embodiment, for the operating method for the CMOS image sensor of the fourth embodiment, the solid-state image pickup device can operate such that high sensitivity and a high S/N ratio can be realized especially in the low-luminance region, while a wide dynamic range is maintained.

Fifth Embodiment

Figure 14:
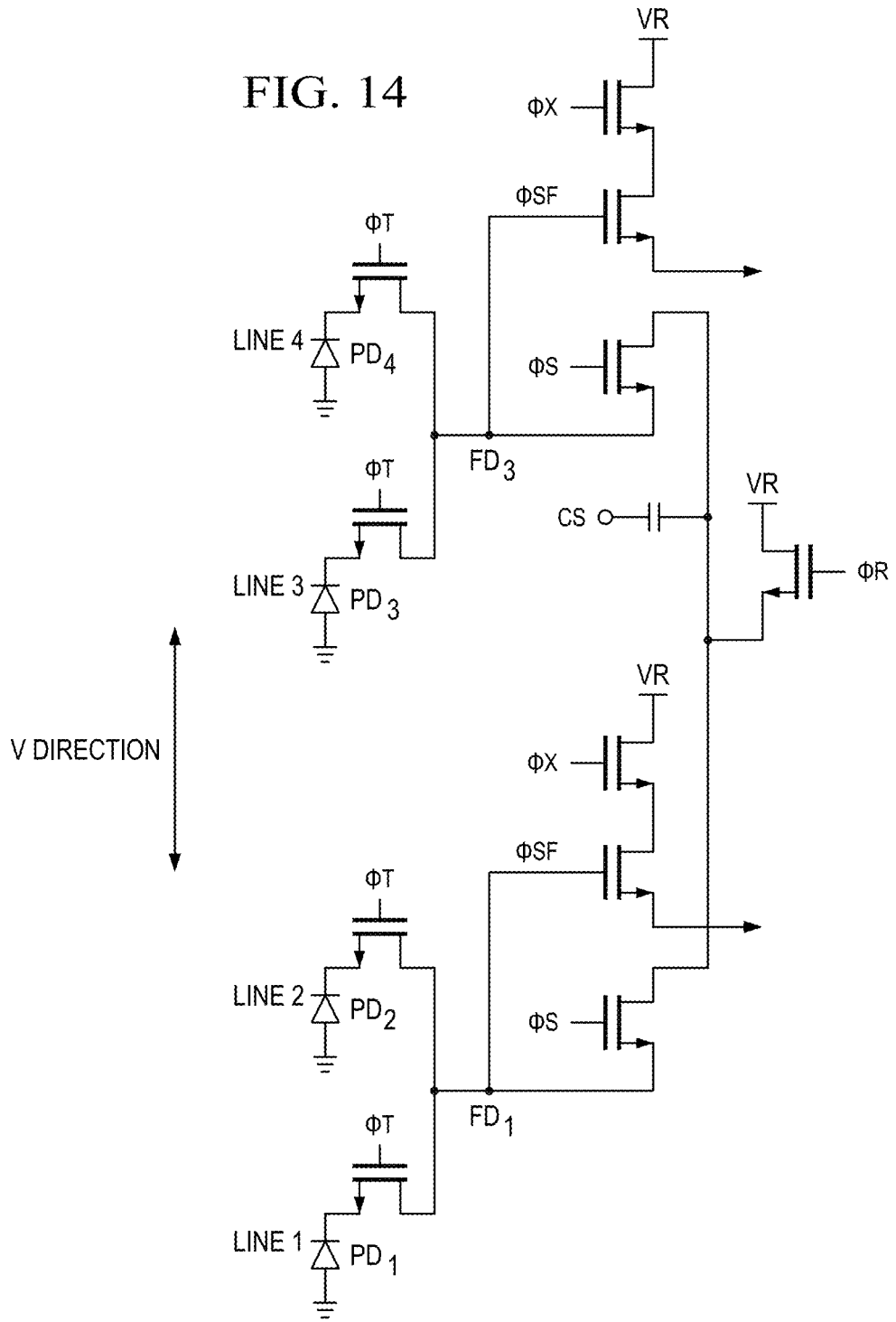
FIG. 14 is an equivalent circuit diagram illustrating a portion of 4 pixels in the CMOS image sensor in the solid-state image pickup device according to a fifth embodiment.

FIG. 14 is an equivalent circuit diagram illustrating a portion of 4 pixels of a CMOS image sensor as the solid-state image pickup device in a fifth embodiment. As shown in FIG. 14, in the vertical direction (the V direction), lines 1-4 are set side-by-side, and four pixels are set. Such pixels have photodiodes $PD_1$-$PD_4$, respectively. Also, each pixel has transfer transistor T. Here, two pixels adjacent in the vertical direction (the V direction) share capacitive coupling transistor S, an amplifying transistor (source follower SF) and selecting transistor X. Along with this, floating diffusion $FD_1$ is shared by the two pixels corresponding to photodiodes $PD_1$, $PD_2$, and floating diffusion $FD_3$ is shared by the two pixels corresponding to photodiodes $PD_3$, $PD_4$. In addition, reset transistor R is set such that it is shared by two capacitive coupling transistors S adjacent in the vertical direction and shared by two pixels, that is, it is shared by four pixels adjacent to each other in the vertical direction. In the CMOS image sensor of the present embodiment, there are 11 transistors for every four pixels, so that the number of transistors for each pixel can be cut to 2.75.

Figure 15:
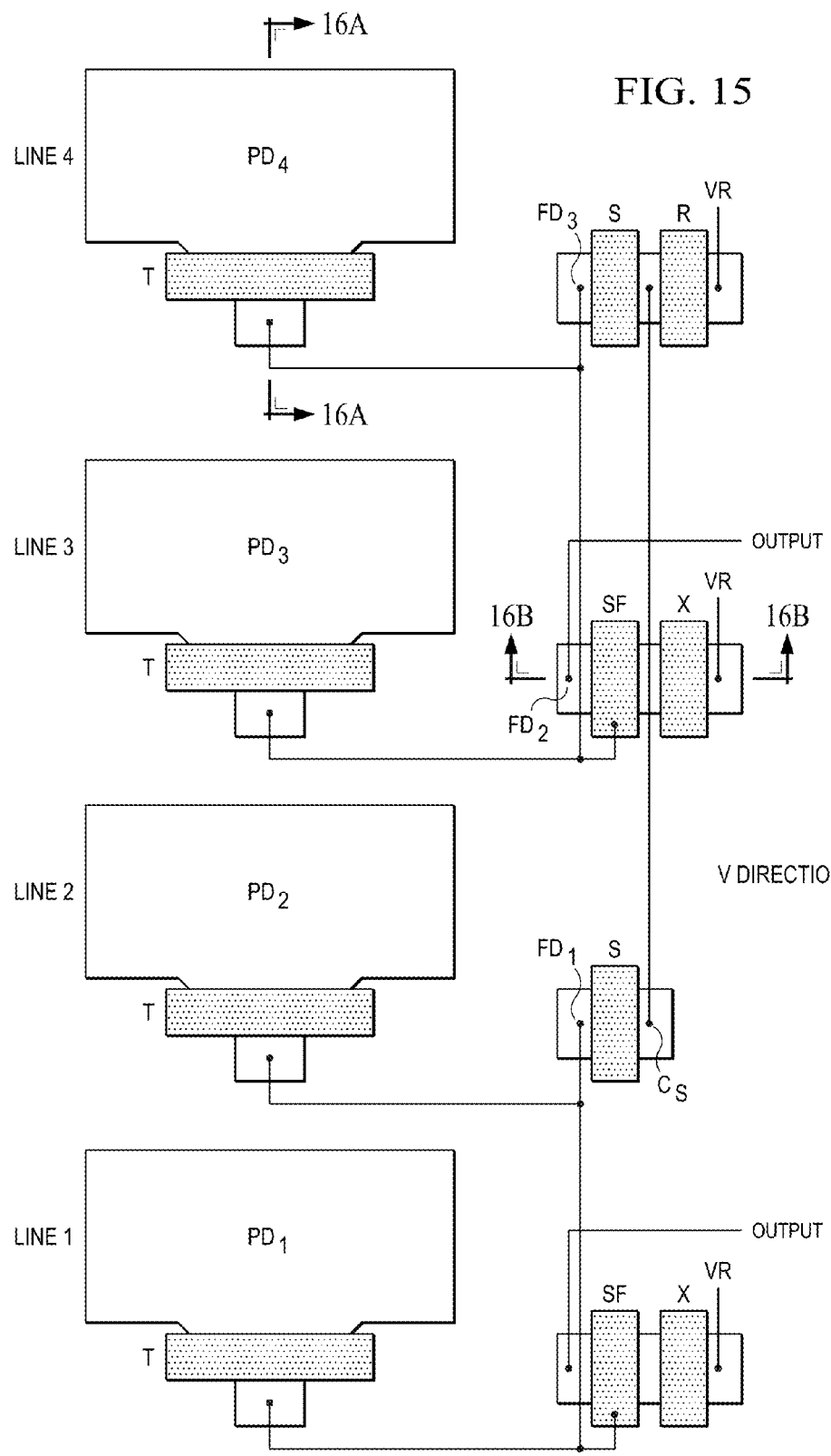
FIG. 15 is a layout diagram illustrating 4 pixels (4 pixels) of the CMOS image sensor of the fifth embodiment.

FIG. 15 is a layout diagram illustrating an example of a portion of four pixels of the CMOS image sensor in the present embodiment. Such photodiodes $PD_1$-$PD_4$ and transfer transistor T are set adjacent to each other in the vertical direction (the V direction), and capacitive coupling transistor S, an amplifying transistor (source follower SF), reset transistor R, and selecting transistor X are set shared by pixels.

Figure 16A:
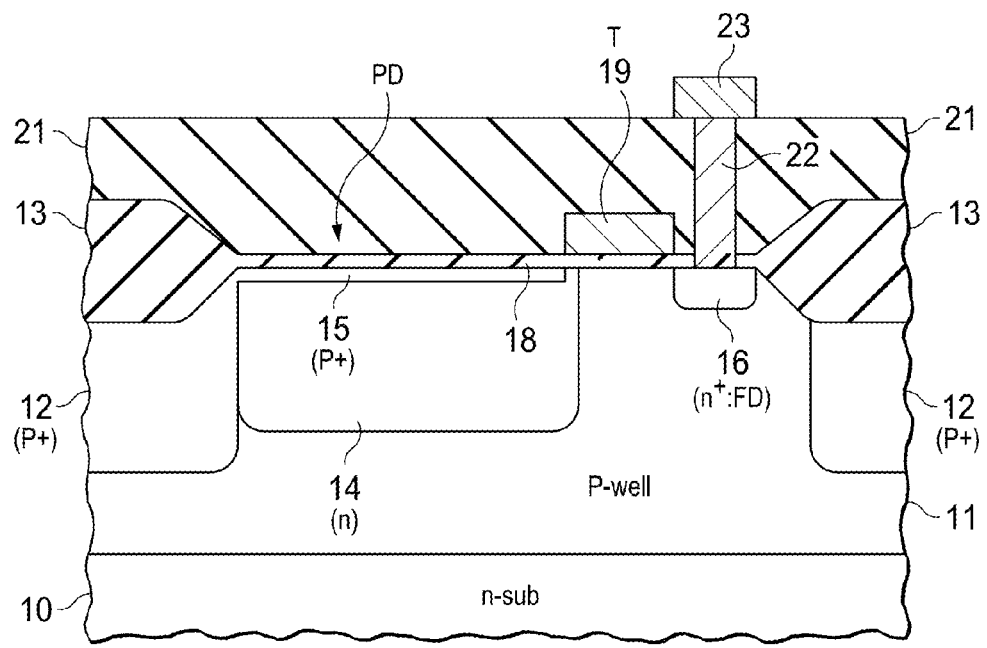
FIG. 16(A) is a cross-sectional view taken along the line A-A' in FIG. 15.

FIG. 16(A) is a cross-sectional view taken across A-A' in FIG. 15. For example, in n-type silicon semiconductor substrate 10 (n-sub), p-type well 11 (p-well) is formed, and photodiodes PD, etc. are divided by p+-type separating region 12 and element separating insulating film 13 using the LOCOS method or the like. In p-type well 11, n-type semiconductor region 14 is formed, and, on its outer layer, $p^+$-type semiconductor region 15 is formed, and, by means of the p-n junction, charge transfer embedding type photodiode PD is formed. At the end portion of n-type semiconductor region 14, a region is formed by a protrusion from p+-type semiconductor region 15. On the outer layer of p-type well 11 separated from such region by a prescribed distance, $n^+$-type semiconductor region 16 as floating diffusion FD is formed.

Here, in the region pertaining to n-type semiconductor region 14 and n$^+$-type semiconductor region 16, on the upper surface of p-type well 11, gate electrode 19 made of polysilicon or the like is formed via gate insulating film 18 made of silicon oxide or the like, and, with n-type semiconductor region 14 and n$^+$-type semiconductor region 16 as the source/drain, transfer transistor T having a channel forming region in the outer layer of p-type well 11 is formed. Also, insulating film 21 made of silicon oxide or the like is formed to cover transfer transistor T; opening portion reaching n$^+$-type semiconductor region 16 is formed; plug 22 is buried in it, and upper-layer wiring 23 is formed on its upper layer. For example, for such upper-layer wiring 23, a region not shown in the figure is connected to the gate electrode of the amplifying transistor.

Figure 16B:
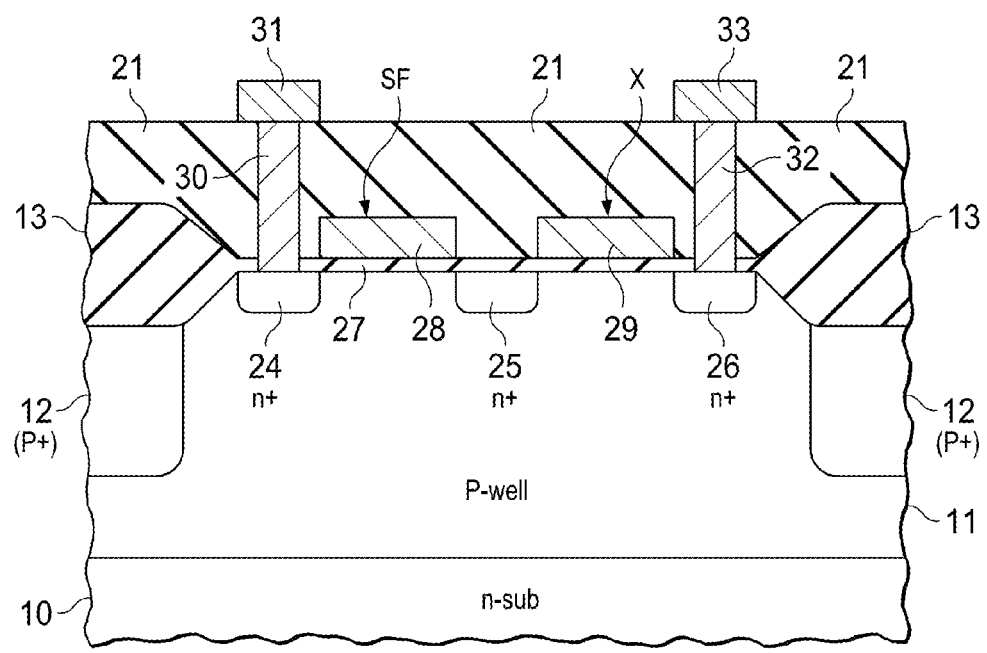
FIG. 16(B) is a cross-sectional view taken along the line B-B' in FIG. 15.

FIG. 16(B) is a cross-sectional view taken across B-B' in FIG. 15. For example, n$^+$-type semiconductor regions 24, 25, 26 are formed separated from each other in regions divided by element separating insulating film 13 of p-type well 11 (p-well) formed on n-type silicon semiconductor substrate 10 (n-sub). Here, in the region pertaining to n$^+$-type semiconductor region 24 and n$^+$-type semiconductor region 25, on the upper surface of p-type well 11, gate electrode 28 made of polysilicon or the like is formed via insulating film 27 made of silicon oxide or the like, and, with n$^+$-type semiconductor region 24 and n$^+$-type semiconductor region 25 taken as source/drain, an amplifying transistor (source follower SF) having a channel forming region in the outer layer of p-type well 11 is formed. Also, in the region pertaining to n$^+$-type semiconductor region 25 and n$^+$-type semiconductor region 26, on the upper surface of p-type well 11, gate electrode 29 made of polysilicon is formed via gate insulating film 27 made of silicon oxide or the like, and, with n$^+$-type semiconductor region 25 and n$^+$-type semiconductor region 26 taken as source/drain, selecting transistor X having a channel forming region in the outer layer of p-type well 11 is formed. Also, insulating film 21 made of silicon oxide is formed to cover the amplifying transistor (source follower SF) and selecting transistor X; opening reaching n$^+$-type semiconductor region 24 is formed, and plug 30 is buried, followed by forming upper layer wiring 31 on its upper layer. For example, such upper layer wiring 31 is connected to the output line at a region not shown in the figure. Also, in insulating film 21, an opening is formed to reach n$^+$-type semiconductor region 26, plug 32 is buried, upper layer wiring 33 is formed on its upper layer, and it is connected to a power source line.

The remaining circuit configuration and the read operating method are the same as those in the first embodiment. Just as in the first embodiment, for the CMOS image sensor of the fifth embodiment, it is possible to realize high sensitivity and a high S/N ratio especially in the low-luminance region, while maintaining a wide dynamic range. Also, just as in the first embodiment, for the operating method for the CMOS image sensor in the fifth embodiment, the solid-state image pickup device can operate such that high sensitivity and a high S/N ratio can be realized especially in the low-luminance region, while a wide dynamic range is maintained.

Sixth Embodiment

Figure 17:
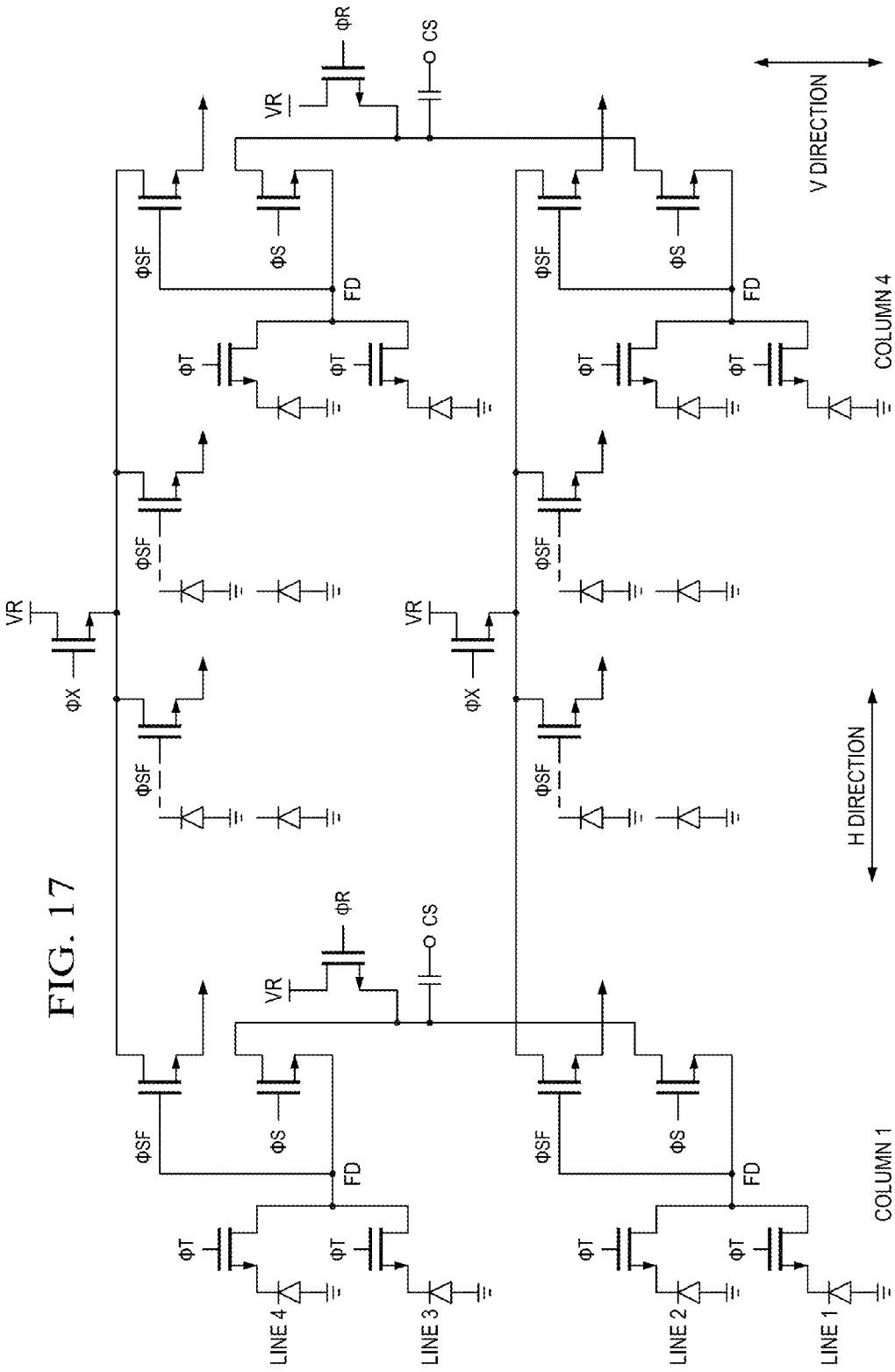
FIG. 17 is an equivalent circuit diagram illustrating a portion of 16 pixels (a portion is not shown) of a CMOS image sensor as the solid-state image pickup device in the present embodiment.

FIG. 17 is an equivalent circuit diagram illustrating a portion of 16 pixels of a CMOS image sensor (displayed with some portions not shown) as the solid-state image pickup device in a sixth embodiment. As shown in FIG. 17, in the vertical direction (the V direction), lines 1-4 are set side-by-side, and, in the horizontal direction, columns 1-4 are set side-by-side. As a result, 16 pixels are set in this configuration. Also, transfer transistor T is set for each pixel. Here, every two pixels adjacent to each other in the vertical direction (the V direction) share capacitive coupling transistor S and an amplifying transistor (source follower SF). Along with this, every two pixels share floating diffusion FD. In addition, reset transistor R is shared by two capacitive coupling transistors S adjacent to each other in the vertical direction with each shared by two pixels. That is, such reset transistor is shared by four pixels adjacent to each other in the vertical direction. Here, such selecting transistor X is shared by four amplifying transistors (source followers SF) adjacent in the horizontal direction (the H direction), that is, it is shared by 8 pixels. The other features of the circuit configuration and the operating method for the read operation are the same as those in the fifth embodiment.

In the CMOS image sensor of the sixth embodiment, there are 38 transistors for every 16 pixels. Consequently, the number per pixel, can be cut to 2.375. Just as in the first embodiment, for the CMOS image sensor of the sixth embodiment, it is possible to realize high sensitivity and a high S/N ratio especially in the low-luminance region, while maintaining a wide dynamic range. Also, according to the sixth embodiment, because the pixels share such selecting transistor X on the side of the power source potential, it also displays a bootstrapping effect. Also, just as in the first embodiment, for the operating method for the CMOS image sensor in the sixth embodiment, the solid-state image pickup device can operate such that high sensitivity and a high S/N ratio can be realized especially in the low-luminance region, while a wide dynamic range is maintained.

In the following, an explanation will be given regarding the characteristics of the CMOS image sensors prepared in the first through sixth embodiments, as compared with those of Comparative Example 1, which adopts the conventional four-transistor configuration, and Comparative Example 2, which adopts the conventional five-transistor configuration and is described in International Patent Application Publication No. WO 2005/083790, Japanese Kokai Patent Application No. 2005-328493, and Japanese Kokai Patent Application No. 2006-217410.

The dynamic range of the CMOS sensor in the first embodiment is much wider than that in Comparative Example 1, and a dynamic range can be guaranteed similar to that of Comparative Example 2. Also, no measure is necessary in handling the dark current of the floating diffusion and additive capacitive element, so it is possible to reduce the burden on development of the process. Also, it is possible to obtain a low-sensitivity output image (second signal) independent of kTC noise. Also, it is possible to reduce the noise level difference when a low sensitivity output and high sensitivity output are synthesized to form an image, and it is possible to obtain natural images without using a noise filter.

TABLE 1

|  | Comparative Example 1 | Comparative Example 2 | Embodiment 1 |
|---|---|---|---|
| Dynamic range (dB) | 72 | 109 | 90 |
| Measure for dark current of FD, CS | Not needed | Needed | Not needed |
| Low-sensitivity output kTC noise (e$^-$rms) | ~0 | 50 | ~0 |
| High-sensitivity/low-sensitivity switching point noise level difference (dB) | N/A | 2.9 | 0.08 |
| Noise filter in image synthesis | N/A | Needed | Not needed |

For the CMOS sensors in the second through sixth embodiments, it is possible to reduce the number of transistors due to sharing them by pixels. As a result, it is possible to increase the area of the photodiodes correspondingly.

TABLE 2

|  | Comparative Example 1 | Comparative Example 2 | Embodiments 2-6 |
|---|---|---|---|
| Number of transistors for each pixel | 2.25-4 | 5 | 2.375-4.25 |
| Number of capacitors for each pixel | 0 | 1 | 0 |
| Photodiode capacity Qsat[e⁻] | 30,000 | 20,000 | 30,000 |

For the CMOS sensors in Embodiments 1-6, it is possible to reduce the electron-number equivalent noise level for each pixel by means of gain-up for the pixels. Also, since gain-up for the latter stage is not necessary, it is possible to reduce the noise in the chip output significantly.

TABLE 3

|  | Comparative Example 1 | Comparative Example 2 | Embodiments 1-6 |
|---|---|---|---|
| Noise quantity for each pixel (e⁻rms) | 5 | 5 | 2 or less |
| Noise quantity at chip output (e⁻rms) (corresponding to 4-fold gain-up ISO400) | 100 | 100 | 53 |

As explained above, for the CMOS image sensor of the present embodiments, the following effects can be realized:

1. Even with low-sensitivity output, it is still possible to cancel the dark current and kTC noise of the floating diffusion and additive capacitive element by handling only the charge stored in the photodiodes, so it is possible to obtain a low-noise image.

2. While a wide dynamic range similar to that of the 5-transistor type conventional scheme described in International Patent Application Publication No. WO 2005/083790, Japanese Kokai Patent Application No. 2005-328493, and Japanese Kokai Patent Application No. 2006-217410 is realized, the use of an additive capacitive element set facing each electrode via an insulating film is not necessary. Consequently, because sharing by pixels is possible, it is possible to realize finer pixels.

3. It is possible to reduce the electron-number equivalent noise quality for each pixel by means of gain-up for the pixels. Also, gain-up in the latter stage is not necessary, so noise is not amplified by the latter stage. As a result, it is possible to significantly lower the noise at the chip output.

The invention is not limited to the foregoing examples. For example, one may also adopt a scheme in which the capacitance ratio between the floating diffusion and the additive capacitive element is adjusted appropriately corresponding to the design, etc. Also, as the additive capacitive element, it is possible to adopt an element prepared by setting two electrodes facing each other via an insulating film. Moreover, those skilled in the art to which the invention relates will appreciate that other modifications may be made within departing from the scope of the claimed invention.

What is claimed is:

1. A pixel element of an image sensor comprising:
   A. a photodiode having a first portion connected to a ground potential and a second portion;
   B. a transfer transistor having a first source/drain portion coupled to the second portion of the photodiode, a second source/drain portion, and a gate coupled to a transfer signal;
   C. a floating diffusion having a first portion coupled to the second source/drain portion of the transfer transistor and a second portion coupled to the ground potential;
   D. a coupling transistor having a first source/drain portion coupled to the first portion of the floating diffusion and the second portion of the transfer transistor, a second source/drain portion, and a gate coupled to a couple signal;
   E. an additive capacitor having a first portion coupled to the second source/drain portion of the coupling transistor and a second portion connected to the ground potential;
   F. a reset transistor having a first source/drain portion coupled to the first portion of the additive capacitor and the second source/drain portion of the coupling transistor, a second portion coupled to a voltage lead, and a gate connected to a reset signal;
   G. a select transistor having a first source/drain portion coupled to the voltage lead, a second source/drain portion, and a gate connected to a select signal; and
   H. an amplifier transistor having a first source/drain portion coupled to the second source/drain portion of the select transistor, a second source/drain portion coupled to an output, and a gate connected to the first portion of the floating diffusion.

2. The image sensor of claim 1 including plural pixel elements connected to the transfer signal, the couple signal, the reset signal, and the select signal.

* * * * *